(12) United States Patent
So et al.

(10) Patent No.: US 11,853,499 B2
(45) Date of Patent: Dec. 26, 2023

(54) DISPLAY PANEL

(71) Applicant: Samsung Display Co., LTD., Yongin-si (KR)

(72) Inventors: Dong-Yoon So, Hwaseong-si (KR); Kyungmin Park, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/202,251

(22) Filed: Mar. 15, 2021

(65) Prior Publication Data

US 2021/0389861 A1 Dec. 16, 2021

(30) Foreign Application Priority Data

Jun. 16, 2020 (KR) .......................... 10-2020-0072942

(51) Int. Cl.
*G06F 3/041* (2006.01)
*H10K 59/126* (2023.01)

(52) U.S. Cl.
CPC ........ *G06F 3/04164* (2019.05); *G06F 3/0412* (2013.01); *H10K 59/126* (2023.02); *G06F 2203/04103* (2013.01)

(58) Field of Classification Search
None
See application file for complete search history.

(56) References Cited

U.S. PATENT DOCUMENTS

| | | | |
|---|---|---|---|
| 8,531,415 B2 | 9/2013 | Kwak et al. | |
| 9,829,749 B2 | 11/2017 | Kim et al. | |
| 9,989,811 B2 | 6/2018 | Go et al. | |
| 2020/0203658 A1* | 6/2020 | Peng | ................... H01L 27/3244 |

FOREIGN PATENT DOCUMENTS

| | | |
|---|---|---|
| KR | 101082294 | 11/2011 |
| KR | 20160065404 | 6/2016 |
| KR | 20160082883 | 7/2016 |

* cited by examiner

*Primary Examiner* — Brian M Butcher
(74) *Attorney, Agent, or Firm* — H.C. Park & Associates, PLC

(57) ABSTRACT

A display panel including a first substrate, a second substrate disposed on the first substrate, a coupling member disposed between the first substrate and the second substrate to couple the first substrate and the second substrate, a plurality of sensing patterns disposed on the second substrate, a plurality of sensing pads disposed on the second substrate and electrically connected to the sensing patterns, respectively, a plurality of protruding portions disposed on the second substrate and extending from the sensing pads, respectively, to an edge of the second substrate, and a light shielding part disposed between the edge of the second substrate and the sensing pads to overlap at least a portion of the coupling member.

20 Claims, 21 Drawing Sheets

DISPLAY PANEL

CROSS-REFERENCE TO RELATED APPLICATIONS

This application claims priority from and the benefit of Korean Patent Application No. 10-2020-0072942, filed on Jun. 16, 2020, which is hereby incorporated by reference for all purposes as if fully set forth herein.

BACKGROUND

Field

Embodiments of the invention relate generally to a display panel having improved manufacturing yield and reliability.

Discussion of the Background

A display panel may be provided by cutting a preliminary display module. The preliminary display module may be cut by using a wheel, a blade, or a laser. As an unnecessary outer area of the preliminary display module is cut, an area of a front surface of the display panel may be reduced. In addition, a ratio of a display area of the display panel with respect to the area of the front surface thereof may be increased.

The above information disclosed in this Background section is only for understanding of the background of the inventive concepts, and, therefore, it may contain information that does not constitute prior art.

SUMMARY

Display panels according to embodiments of the invention are capable of improving manufacturing yield and reliability.

Embodiments also provide a display panel having a narrow bezel.

Additional features of the inventive concepts will be set forth in the description which follows, and in part will be apparent from the description, or may be learned by practice of the inventive concepts.

A display panel according to an embodiment includes a first substrate, a second substrate disposed on the first substrate, a coupling member disposed between the first substrate and the second substrate to couple the first substrate and the second substrate, a plurality of sensing patterns disposed on the second substrate, a plurality of sensing pads disposed on the second substrate and electrically connected to the plurality of sensing patterns, respectively, a plurality of protruding portions disposed on the second substrate and extending from the plurality of sensing pads, respectively, to an edge of the second substrate, and a light shielding part disposed between the edge of the second substrate and the plurality of sensing pads to overlap at least a portion of the coupling member.

The light shielding part may extend in a first direction, each of the plurality of protruding portions may extend in a second direction crossing the first direction, and the light shielding part and the plurality of protruding portions may be connected to each other.

The light shielding part may include a plurality of grooves defined adjacent to an area where the plurality of protruding portions cross the light shielding part.

Each of the plurality of grooves may extend in the second direction and may have a length in the second direction less than a width of the light shielding part in the second direction.

The light shielding part may include a plurality of light shielding patterns spaced apart from the plurality of protruding portions.

A gap between adjacent light shielding patterns among the light shielding patterns and a gap between adjacent ones of the plurality of light shielding patterns and the plurality of protruding portions may each be equal to or less than about 4 μm.

The plurality of light shielding patterns may include a first light shielding pattern and a second light shielding pattern spaced apart from each other with one of the plurality of protruding portions therebetween, and the display panel may further include an additional connection portion connected to the first light shielding pattern, the second light shielding pattern, and the protruding portion.

A groove having one end closed by the additional connection portion may be defined between the first light shielding pattern and the protruding portion, and the groove may have a length in a second direction crossing the first direction greater than a width of the first light shielding pattern in the second direction.

The plurality of protruding portions and the light shielding part may be disposed on the same layer and comprise the same material as each other, and the plurality of protruding portions and the light shielding part may be spaced apart from each other.

The display panel may further include a connection portion disposed adjacent to the edge of the second substrate and electrically connected to the plurality of protruding portions, and a plurality of bridge patterns contacting the plurality of protruding portions, respectively, and electrically connected to the connection portion, in which the plurality of bridge patterns may overlap the light shielding part.

Another portion of the coupling member not overlapping the light shielding part may have a coupling force greater than the one portion of the coupling member when viewed in a thickness direction of the second substrate.

A display panel according to another embodiment includes a first substrate, a second substrate disposed on the first substrate and having an edge extending in a first direction, a sensing pattern disposed on the second substrate, a sensing pad disposed on the second substrate and electrically connected to the sensing pattern, a protruding portion disposed on the second substrate and extending from the sensing pad to the edge of the second substrate, and a light shielding pattern disposed on the second substrate and spaced apart from the protruding portion.

The edge of the second substrate may be aligned with a side surface of the light shielding pattern and a side surface of the protruding portion.

The edge of the second substrate may be aligned with a side surface of the light shielding pattern, and the protruding portion may be spaced apart from the edge of the second substrate with the light shielding pattern therebetween.

The display panel may further include a bridge pattern connected to the protruding portion, in which the bridge pattern may extend from the protruding portion to the edge of the second substrate and overlap the light shielding pattern.

The protruding portion and the light shielding pattern may be disposed on the same layer and include the same material as each other.

A gap between the protruding portion and the light shielding pattern may be equal to or less than about 4 μm.

The display panel may further include a coupling member disposed between the first substrate and the second substrate, in which the edge of the second substrate may overlap the coupling member.

A display panel according to still another embodiment includes a first substrate, a second substrate disposed on the first substrate and having a top surface, a side surface, and a boundary defined between the top surface and the side surface, a coupling member disposed between the first substrate and the second substrate, a sensing pattern disposed on the top surface of the second substrate, and a sensing pad disposed on the top surface of the second substrate and electrically connected to the sensing pattern, in which the side surface of the second substrate includes a first side portion extending from the boundary and a second side portion extending from the first side portion to a side surface of the coupling member, and the second side portion protrudes outwardly further than the boundary.

The display panel may further include a protruding portion disposed on the top surface of the second substrate and extending from the sensing pad to the boundary, and a light shielding pattern disposed on the top surface of the second substrate and spaced apart from the protruding portion, in which a side surface of the light shielding pattern may be aligned with the boundary of the second substrate.

A method of manufacturing a display panel according to yet another embodiment includes forming a first preliminary substrate, forming a second preliminary substrate having substantially the same area as the first preliminary substrate, the second preliminary substrate including a plurality of sensing patterns, a plurality of sensing pads respectively connected to the sensing patterns, and a plurality of protruding portions respectively extending from the sensing pads to an edge of the second preliminary substrate, forming a coupling member between the first and second preliminary substrates, forming a light shielding part connected to the plurality of protruding portions and between the edge of the second preliminary substrate and the sensing pads to overlap at least a portion of the coupling member, irradiating the coupling member with a laser to couple the first and second preliminary substrates to each other, and cutting the first preliminary substrate and the second preliminary substrate. The light shielding part blocks the laser and is spaced apart from the protruding portions. After the first preliminary substrate and the second preliminary are cut, the light shielding part is electrically separated from the plurality of protruding portions.

The method may further include cutting the first and second preliminary substrates along a first cutting line formed between the protruding portions and the edge of the second preliminary substrate.

The protruding portions may be connected to each other by a connection portion disposed between the first cutting line and the edge of the second preliminary substrate.

Cutting the first and second preliminary substrates may include cutting a first portion of the first preliminary substrate and a first portion of the second preliminary substrate at opposing directions with a cutting member, and the coupling member that is disposed between the first portions of the first and second preliminary substrates may not be contacted by the cutting member.

Cutting the first and second preliminary substrates may further include breaking the first and second substrates along the first cutting line, such that at least a portion of a side surface of the coupling member is protruded outwardly further than portions of side surfaces of the first and second preliminary substrates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1A:
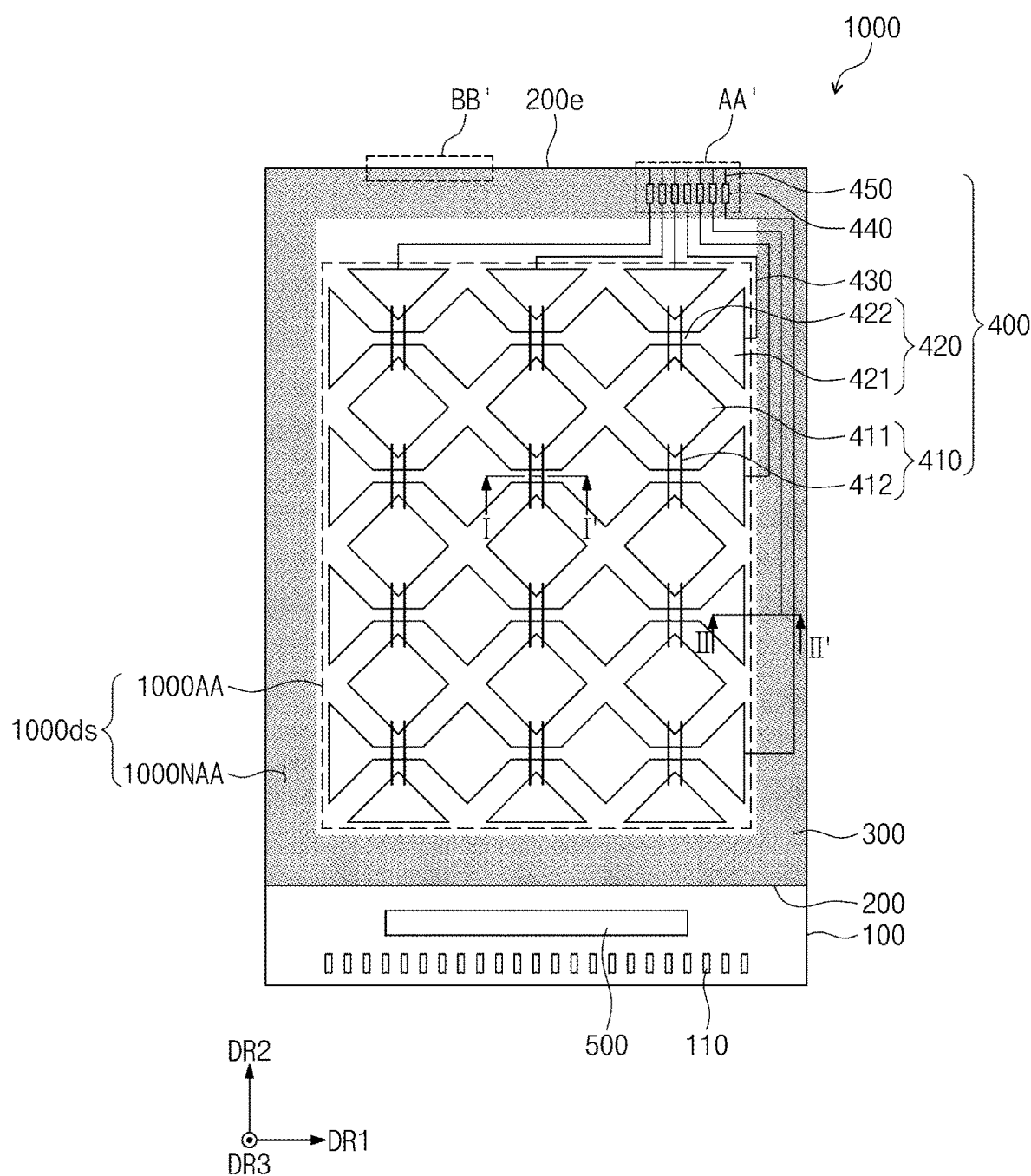
FIG. 1A is a plan view illustrating a display panel according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
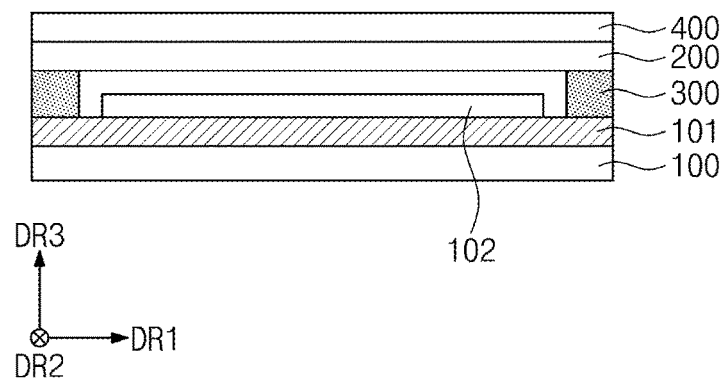
FIG. 1B is a schematic cross-sectional view illustrating the display panel according to an embodiment.

FIG. 1A is a plan view illustrating a display panel according to an embodiment. FIG. 1B is a schematic cross-sectional view illustrating the display panel according to an embodiment.

Referring to FIGS. 1A and 1B, a display panel 1000 may generate an image and sense an external input applied from the outside of the display panel 1000.

The display panel 1000 may display an image through a display surface 1000ds. The display surface 1000ds may be parallel to a surface defined by a first direction DR1 and a second direction DR2. A normal direction of the display surface 1000ds, i.e., a thickness direction of the display panel 1000, indicates a third direction DR3. Hereinafter, a front surface (or top surface) and a rear surface (or bottom surface) of each of layers or units may be distinguished by the third direction DR3.

Although the display panel 1000 having the display surface 1000ds is illustrated in an embodiment, the inventive concepts are not limited thereto. For example, the display panel 1000 may have a curved display surface or a three-dimensional display surface. The three-dimensional display surface may include a plurality of display areas indicating different directions.

In the display surface 1000ds, a display area 1000AA and a non-display area 1000NAA may be defined. The display area 1000AA may be activated by an electric signal. For example, the display panel 1000 may display an image through the display area 1000AA and sense an input applied from the outside through the display area 1000AA.

The non-display area 1000NAA, as an area surrounding the display area 1000AA, may be referred to as a bezel area or a peripheral area. Although FIG. 1A exemplarily illustrates that the non-display area 1000NAA surrounds the entire display area 1000AA, the inventive concepts are not limited thereto.

As an area of the non-display area 1000NAA decreases, an entire area of the display panel 1000 may also be decreased. For example, the area may represent an area when viewed in a thickness direction of the display panel 1000, e.g., when viewed from the third direction DR3. That is, when the area of the non-display area 1000NAA decreases, a ratio of the area of the display area 1000AA with respect to a front surface of the display panel 1000 may increase.

The display panel 1000 may include a first substrate 100, a circuit layer 101, a light emitting device layer 102, a second substrate 200, a coupling member 300, a sensor 400, and a driving chip 500.

The first substrate 100, the circuit layer 101, the light emitting device layer 102, and the second substrate 200 may also be referred to as a display layer, and the display layer may display an image.

The first substrate 100 may provide a base surface on which the circuit layer 101 is disposed. The first substrate 100 may be a glass substrate, a metal substrate, or a polymer substrate. However, the inventive concepts are not limited thereto. For example, in some embodiments, the first substrate 100 may be an inorganic layer, an organic layer, or a composite material layer.

The circuit layer 101 may be disposed on the first substrate 100. The circuit layer 101 may include an insulation layer, a semiconductor pattern, a conductive pattern, and a signal line. The insulation layer, the semiconductor pattern, and the conductive pattern may be provided by a method such as coating and deposition, and then the insulation layer, the semiconductor pattern, and the conductive pattern may be selectively patterned by performing a photolithography process. Thereafter, the semiconductor pattern, the conductive pattern, and the signal line, which are included in the circuit layer 101, may be provided.

The light emitting device layer 102 may be disposed on the circuit layer 101. The light emitting device layer 102 may include a light emitting device. For example, the light emitting device layer 102 may include an organic light emitting material, a quantum dot, a quantum rod, a micro-LED, or a nano-LED.

The second substrate 200 may be disposed on the first substrate 100. The second substrate 200 may include a base substrate. The second substrate 200 may also be referred to as a cover substrate or an opposite substrate. Although the base substrate of the second substrate 200 may include a glass substrate or an organic/inorganic composite material substrate, the inventive concepts are not limited thereto.

The first substrate 100 may have an area greater than that of the second substrate 200. The area may represent an area of a plane parallel to the first direction DR1 and the second direction DR2. As such, one portion of the first substrate 100 may be exposed instead of being covered by the second substrate 200. The driving chip 500 may be mounted to the one portion of the first substrate 100, and display pads 110 disposed on the first substrate 100 may be exposed to the outside. The display pads 110 may be electrically connected to pixels disposed on the first substrate 100.

Although FIG. 1A exemplarily illustrates that the driving chip 500 and the display pads 110 are disposed on the first substrate 100, the inventive concepts are not limited thereto. For example, in some embodiments, the driving chip 500 may be mounted on a printed circuit film, and the printed circuit film may be attached to the first substrate 100. Also, the display pads 110 may be disposed on a side surface of the first substrate 100 instead of a top surface of the first substrate 100. In this case, the first substrate 100 and the second substrate 200 may have the same area as each other.

The coupling member 300 may be disposed between the first substrate 100 and the second substrate 200. The coupling member 300 may be disposed in the non-display area 1000NAA of the display panel 1000. When viewed on a plane, e.g., when viewed in the third direction DR3, the coupling member 300 may have a ring shape surrounding the display area 1000AA.

The coupling member 300 may include an inorganic material or an organic material. For example, the inorganic material may include a frit seal, and the organic material may include a photo-curable resin or a photo-plastic resin. However, the inventive concepts are not limited to a particular material of the coupling member 300.

At least a portion of a side surface of the coupling member 300 may be aligned with at least a portion of a side surface of the second substrate 200. A portion of the second substrate 200, which overlaps the coupling member 300, may be cut when the second substrate 200 is cut to provide a narrow bezel, which reduces the area of the non-display area 1000NAA. Thus, at least a portion of the side surface of the coupling member 300 may be aligned with at least a portion of the side surface of the second substrate 200.

The sensor 400 may be disposed on the second substrate 200. The sensor 400 may sense an external input applied from the outside. The external input may be an input of a user. For example, the input of the user may include various types of external inputs, such as a portion of a user's body, light, heat, a pen, or pressure.

The sensor 400 may include a plurality of first sensing electrodes 410 (hereinafter, referred to as first sensing electrodes), a plurality of second sensing electrodes 420 (hereinafter, referred to as second sensing electrodes), a plurality of sensing lines 430 (hereinafter, referred to as sensing lines), a plurality of sensing pads 440 (hereinafter, referred to as sensing pads), and a plurality of protruding portions 450 (hereinafter, referred to as protruding portions).

The first sensing electrodes 410 and the second sensing electrodes 420 may be disposed in the display area 1000AA. The sensor 400 may acquire information on the external input through a variation of a mutual capacitance between the first sensing electrodes 410 and the second sensing electrodes 420.

The first sensing electrodes 410 may be spaced apart from each other in the first direction DR1. Each of the first sensing electrodes 410 may extend in the second direction DR2. The second sensing electrodes 420 may be spaced apart from each other in the second direction DR2. Each of the second sensing electrodes 420 may extend in the first direction DR1. The first sensing electrodes 410 and the second sensing electrodes 420 may cross each other.

Each of the first sensing electrodes 410 may include a plurality of sensing patterns 411 (hereinafter, referred to as sensing patterns) and a bridge pattern 412 electrically connected to two neighboring sensing patterns 411 of the sensing patterns 411. The sensing patterns 411 and the bridge pattern 412 may be disposed on different layers. Although FIG. 1A exemplarily illustrates two bridge patterns 412 connecting two sensing patterns 411, in some embodiments, one bridge pattern 412 or three or more bridge patterns 412 may be provided between two sensing patterns 411.

Each of the second sensing electrodes 420 may include a plurality of first portions 421 (hereinafter, referred to as first portions) and a second portion 422 defined between neighboring first portions 421 of the first portions 421. The first portions 421 may be referred to as sensing portions, and the second portions 422 may be referred to as a connecting portion or a crossing portion.

The first portions 421 and the second portion 422 may be connected to each other, and thus, have an integrated shape. Thus, the second portion 422 may be defined as a portion crossing the bridge pattern 412 in each of the second sensing electrodes 420. The first portions 421 and the second portion 422 may be disposed on the same layer. Also, the first portions 421 and the second portion 422 may be disposed on the same layer as the sensing patterns 411.

Figure 1C:
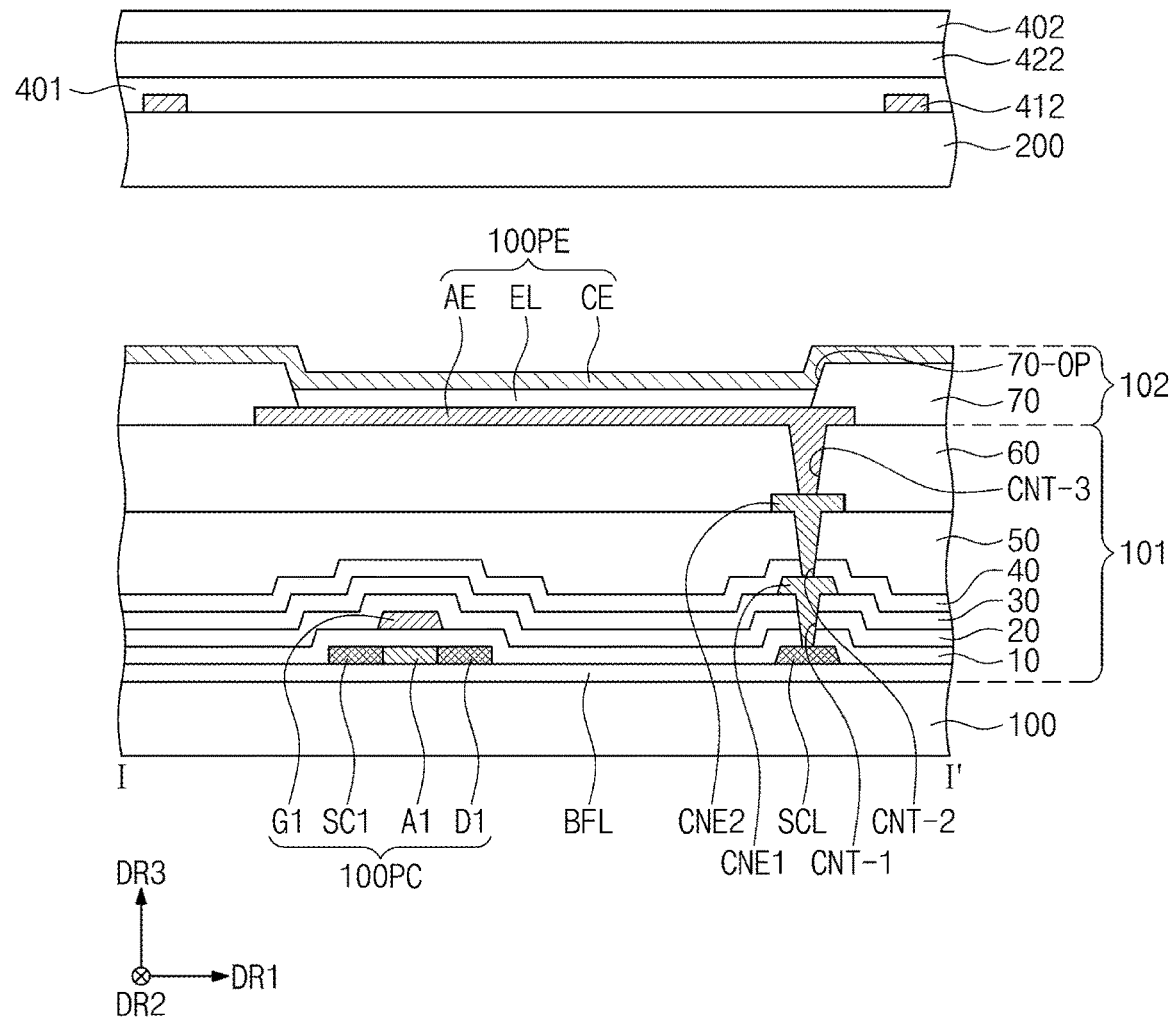
FIG. 1C is a cross-sectional view taken along line I-I' of FIG. 1A.

In FIG. 1C, although a layer on which the bridge pattern 412 is disposed is illustrated as being closer to the second substrate 200 than the layer on which the first portions 421, the second portion 422, and the sensing patterns 411 are disposed, the inventive concepts are not limited thereto. For example, in some embodiments, the layer on which the first portions 421, the second portion 422, and the sensing patterns 411 are disposed may be closer to the second substrate 200 than the layer on which the bridge pattern 412 is disposed.

The bridge pattern 412 may include a metal material, and each of the first portions 421, the second portion 422, and the sensing patterns 411 may include a transparent conductive material. The bridge pattern 412 may have a single-layer structure including molybdenum, silver, titanium, copper, aluminum, or an alloy thereof, or a multi-layer structure having a three-layer structure of titanium/aluminium/titanium. Each of the first portions 421, the second portion 422, and the sensing patterns 411 may include a transparent conductive oxide, such as an indium tin oxide (ITO), an indium zinc oxide (IZO), a zinc oxide (ZnO), and an indium zinc tin oxide (IZTO).

However, the inventive concepts are not limited thereto. For example, in some embodiments, each of the first portions 421, the second portion 422, and the sensing patterns 411 may have a single-layer structure including molybdenum, silver, titanium, copper, aluminum, or an alloy thereof, or a multi-layer structure having a three-layer structure of titanium/aluminum/titanium. In this case, each of the first portions 421, the second portion 422, and the sensing patterns 411 may have a mesh structure.

Each of the first sensing electrodes 410 and the second sensing electrodes 420 may be electrically connected to at least one of the sensing lines 430. For example, one first sensing electrode 410 may be connected to one sensing line 430. One second sensing electrode 420 may be electrically connected to one sensing line 430. However, the inventive concepts are not limited thereto. For example, in some embodiments, one first sensing electrode 410 may be connected to two sensing lines 430. The first sensing electrode 410 may have one end electrically connected to one sensing line 430 and the other end electrically connected to another sensing line 430.

The sensing pads 440 may be electrically connected to the sensing lines 430, respectively. The sensing pads 440 may be disposed adjacent to an edge 200e of the second substrate 200. The edge 200e may be a boundary between a top surface and a side surface of the second substrate 200.

Although FIG. 1A exemplarily illustrates that the sensing pads 440 are disposed adjacent to the edge 200e extending in the first direction DR1, the inventive concepts are not limited thereto. For example, in some embodiments, the sensing pads 440 may be disposed adjacent to an edge extending in the second direction DR2.

The sensing pads 440 may be disposed on the coupling member 300 with the second substrate 200 therebetween. Thus, the sensing pads 440 and the coupling member 300 may overlap each other when viewed in the thickness direction of the display panel 1000, e.g., when viewed in the third direction DR3.

The protruding portions 450 may each extend from the sensing pads 440 toward the edge 200e. The protruding portions 450 may be spaced apart from each other in the first direction DR1, and may each have a width in the first direction DR1 less than that of each of the sensing pads 440.

FIG. 1C is a cross-sectional view taken along line I-I' of FIG. 1A.

Referring to FIG. 1C, at least one inorganic layer is provided on the top surface of the first substrate 100. The inorganic layer may include at least one of an aluminum oxide, a titanium oxide, a silicon oxide, a silicon oxynitride, a zirconium oxide, and a hafnium oxide. The inorganic layer may have multiple layers. The multi-layered inorganic layers may include a barrier layer and/or a buffer layer.

A buffer layer BFL may improve a coupling force between the first substrate 100 and the semiconductor pattern. The buffer layer BFL may include a silicon oxide layer and a silicon nitride layer, and the silicon oxide layer and the silicon nitride layer may be alternately laminated with each other.

The semiconductor pattern may be disposed on the buffer layer BFL. The semiconductor pattern may include polysilicon. However, the inventive concepts are not limited thereto. For example, the semiconductor pattern may include amorphous silicon or oxide semiconductor.

FIG. 1C merely illustrates a portion of the semiconductor pattern, and the semiconductor pattern may be further disposed in other areas. The semiconductor pattern may be arranged over the pixels in a predetermined manner. The semiconductor pattern may have a varying electrical property depending on the dopant. The semiconductor pattern may include a first area having high conductivity and a second area having low conductivity. The first area may be doped with an n-type dopant or a p-type dopant. A p-type transistor may include a doped area that is doped with the p-type dopant, and an n-type transistor may include a doped area that is doped with the n-type dopant. The second area may be a non-doped area or an area doped with a lower concentration than the first area.

The first area may have conductivity greater than the second area, and the first area substantially functions as an electrode or a signal line. The second area may substantially correspond to an active (or channel) of a transistor. In particular, one portion of the semiconductor pattern may be the active of the transistor, another portion may be a source or a drain of the transistor, and another portion may be a connection electrode or a connection signal line.

Each of the pixels may have an equivalent circuit including seven transistors, one capacitor, and a light emitting device, and the layout of the equivalent circuit may be varied in other embodiments. In FIG. 1C, one transistor 100PC and one light emitting device 100PE included in the pixel are exemplarily illustrated.

A source SC1, an active A1, and a drain D1 of the transistor 100PC may be provided from the semiconductor pattern. The source S1 and the drain D1 may extend in opposite directions from the active A1 in a cross-section. In FIG. 1C, a portion of the connection signal line SCL provided from the semiconductor pattern is illustrated. The connection signal line SCL may be electrically connected to the drain D1 of the transistor 100PC on a plane.

A first insulation layer 10 may be disposed on the buffer layer BFL. The first insulation layer 10 may overlap the pixels in common and cover the semiconductor pattern. The first insulation layer 10 may be an inorganic layer and/or an organic layer, and may have a single-layer or multi-layer structure. The first insulation layer 10 may include at least one of an aluminum oxide, a titanium oxide, a silicon oxide, a silicon oxynitride, a zirconium oxide, and a hafnium oxide. In the illustrated embodiment, the first insulation layer 10 may be a single-layered silicon oxide layer. Also, an insulation layer of the circuit layer 101, which will be described later, may be an inorganic layer and/or an organic layer in addition to the first insulation layer 10, and may have a single-layer or multi-layer structure. Although the inorganic layer may include at least one of the above-described materials, the inventive concepts are not limited thereto.

A gate G1 of the transistor 100PC may be disposed on the first insulation layer 10. The gate G1 may be a portion of a metal pattern. The gate G1 overlaps the active A1. The gate G1 may function as a mask in a process of doping the semiconductor pattern.

A second insulation layer 20 may be disposed on the first insulation layer 10 to cover the gate G1. The second insulation layer 20 may overlap the pixels in common. The second insulation layer 20 may be an inorganic layer and/or an organic layer, and may have a single-layer or multi-layer structure. In the illustrated embodiment, the second insulation layer 20 may be a single-layered silicon oxide layer.

A third insulation layer 30 may be disposed on the second insulation layer 20. In the illustrated embodiment, the third insulation layer 30 may be a single-layered silicon oxide layer.

A first connection electrode CNE1 may be disposed on the third insulation layer 30. The first connection electrode CNE1 may be connected to the connection signal line SCL through a contact hole CNT-1 passing through the first, second, and third insulation layers 10, 20, and 30.

A fourth insulation layer 40 may be disposed on the third insulation layer 30. The fourth insulation layer 40 may be a single-layered silicon oxide layer, for example. A fifth insulation layer 50 may be disposed on the fourth insulation layer 40. The fifth insulation layer 50 may be an organic layer.

A second connection electrode CNE2 may be disposed on the fifth insulation layer 50. The second connection electrode CNE2 may be connected to the first connection electrode CNE1 through a contact hole CNT-2 passing through the fourth and fifth insulation layers 40 and 50.

A sixth insulation layer 60 may be disposed on the fifth insulation layer 50 to cover the second connection electrode CNE2. The sixth insulation layer 60 may be an organic layer. The light emitting device layer 102 may be disposed on the circuit layer 101. The light emitting device layer 102 may include a light emitting device 100PE. For example, the light emitting device layer 102 may include an organic light emitting material, a quantum dot, a quantum rod, a micro-LED, or a nano-LED. The light emitting device 100PE may include a first electrode AE, a light emitting layer EL, and a second electrode CE.

The first electrode AE may be disposed on the sixth insulation layer 60. The first electrode AE may be connected to the second connection electrode CNE2 through a contact hole CNT-3 passing through the sixth insulation layer 60.

A pixel defining layer 70 may be disposed on the sixth insulation layer 60 to cover a portion of the first electrode AE. An opening 70-OP is defined in the pixel defining layer 70. The opening 70-OP of the pixel defining layer 70 exposes at least a portion of the first electrode AE. In the illustrated embodiment, a light emitting area is defined to correspond at least a portion of the first electrode AE exposed by the opening 70-OP. A non-light emitting area may surround the light emitting area.

The light emitting layer EL may be disposed on the first electrode AE. The light emitting layer EL may be disposed in the opening 70-OP. In particular, the light emitting layer EL may be separately provided in each of the pixels. When the light emitting layer EL is separately provided in each of the pixels, each of the light emitting layers EL may emit light having at least one color of blue, red, and green. However, the inventive concepts are not limited thereto. For example, in some embodiments, the light emitting layer EL may be connected to the pixels and provided in common. In this case, the light emitting layer EL may provide blue light or white light.

The second electrode CE may be disposed on the light emitting layer EL. The second electrode CE may have an integrated shape and be disposed on the pixels in common. A common voltage may be provided to the second electrode CE, and the second electrode CE may be referred to as a common electrode.

Although not shown, a hole control layer may be disposed between the first electrode AE and the light emitting layer EL. The hole control layer may be disposed in the light emitting area and the non-light emitting area in common. The hole control layer may include a hole transport layer and a hole injection layer. An electron control layer may be disposed between the light emitting layer EL and the second electrode CE. The electron control layer may include an electron transport layer and an electron injection layer. The hole control layer and the electron control layer may be provided to the pixels in common by using an open mask.

The second substrate 200 may be disposed on the light emitting device layer 102.

The sensor layer 400 (refer to FIG. 1B) may be provided on the second substrate 200. According to an embodiment, a separate adhesive member may not be disposed between the sensor layer 400 (refer to FIG. 1B) and the second substrate 200. In this manner, the display panel 1000 may have a further decreased thickness.

The bridge pattern 412 may be disposed on the second substrate 200. Although FIG. 1C exemplarily illustrates that the bridge pattern 412 directly contacts a top surface of the second substrate 200, the inventive concepts are not limited thereto. For example, in some embodiments, a buffer layer may be further disposed on the top surface of the second substrate 200, and the bridge pattern 412 may contact a top surface of the buffer layer. The buffer layer may include an organic layer, an inorganic layer, or organic and inorganic layers.

A sensing insulation layer 401 may be disposed on the second substrate 200 to cover the bridge pattern 412.

The second portion 422 may be disposed on the sensing insulation layer 401. The first portions 421 (refer to FIG. 1A) and the sensing patterns 411 (refer to FIG. 1A) may be also disposed on the sensing insulation layer 401 in addition to the second portion 422.

A cover insulation layer 402 may be disposed on the sensing insulation layer 401 to cover the second portion 422.

At least one of the sensing insulation layer 401 and the cover insulation layer 402 may include an inorganic layer. The inorganic layer may include at least one of an aluminum oxide, a titanium oxide, a silicon oxide, a silicon oxynitride, a zirconium oxide, and a hafnium oxide.

At least one of the sensing insulation layer 401 and the cover insulation layer 402 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

Figure 1D:
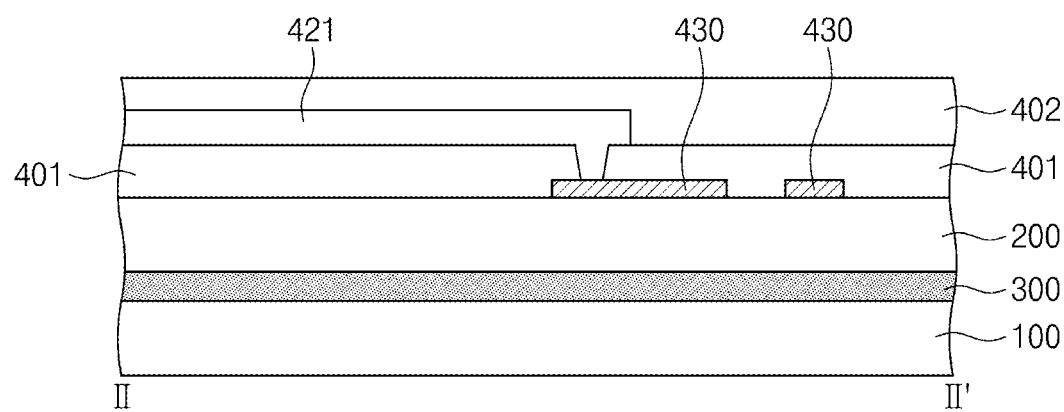
FIG. 1D is a cross-sectional view taken along line II-II' of FIG. 1A.
Figure 1D:
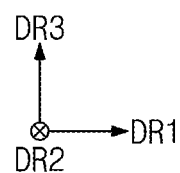

FIG. 1D is a cross-sectional view taken along line II-II' of FIG. 1A. FIG. 1D exemplarily illustrates an area in which the sensing lines 430 are disposed. The sensing lines 430 may be disposed between the second substrate 200 and the sensing insulation layer 401. The sensing lines 430 may be provided through substantially the same process and include substantially the same material as the bridge pattern 412 (refer to FIG. 1C).

Although FIG. 1D exemplarily illustrates that the sensing lines 430 are provided on the same layer as the bridge pattern 412 (refer to FIG. 1C), the inventive concepts are not limited thereto. For example, in some embodiments, each of the sensing lines 430 may include a first line pattern disposed on the same layer as the bridge pattern 412 (refer to FIG. 1C) and a second line pattern disposed on the same layer as the second portion 422 (refer to FIG. 1C). In this case, the first line pattern and the second line pattern of each of the sensing lines 430 may be electrically connected to each other.

Figure 2:
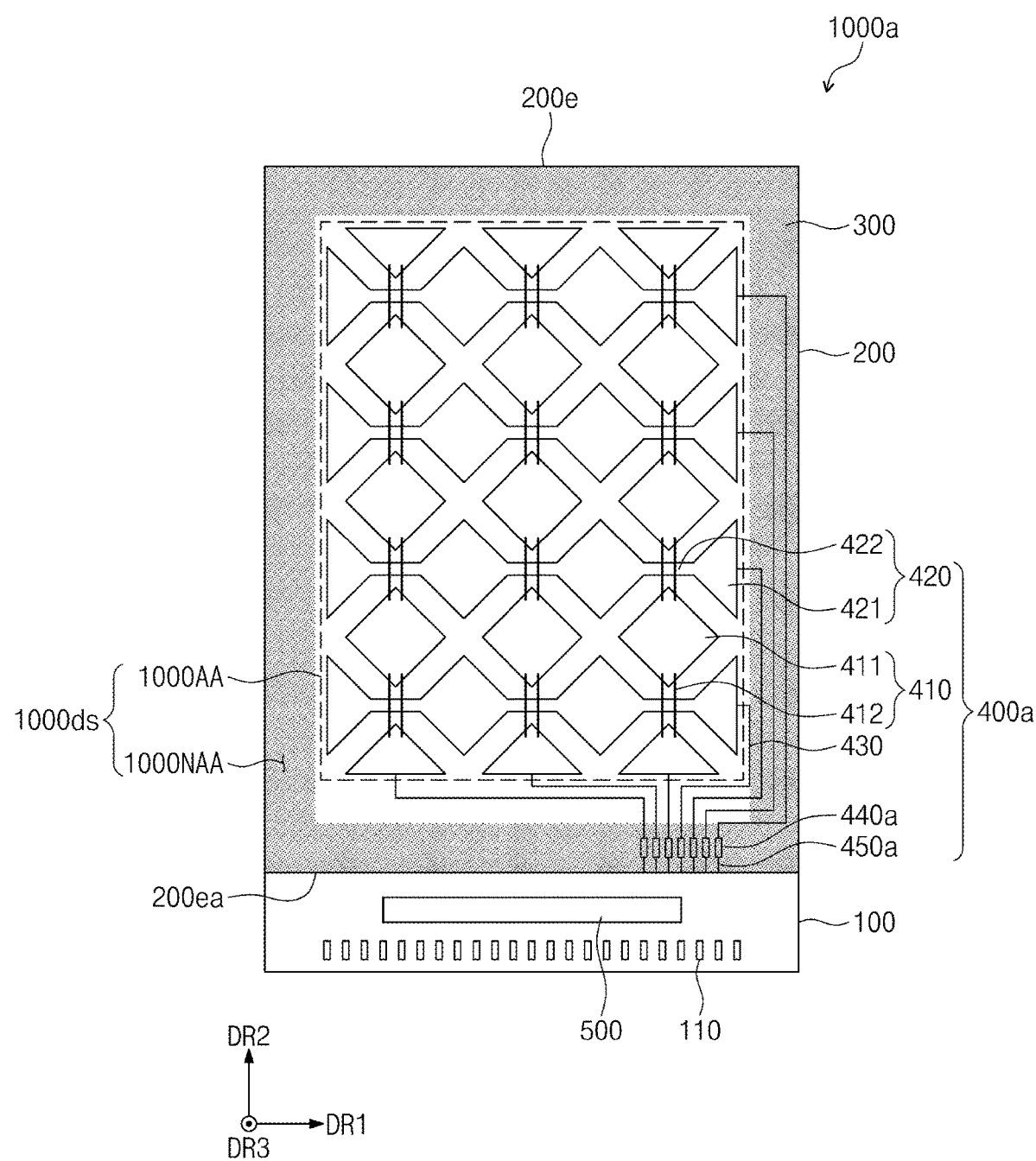
FIG. 2 is a plan view illustrating a display panel according to an embodiment.

FIG. 2 is a plan view illustrating a display panel according to an embodiment.

Referring to FIG. 2, a display panel 1000a may include a first substrate 100, a second substrate 200, a coupling member 300, a sensor 400a, and a driving chip 500. The sensor 400a may include first sensing electrodes 410, second sensing electrodes 420, sensing lines 430, sensing pads 440a, and protruding portions 450a.

The sensing pads 440a may be disposed adjacent to an edge 200ea of the second substrate 200. The edge 200ea of the second substrate 200 may be defined in an area overlapping the first substrate 100. When viewed on a plane, the edge 200ea may be defined between a display area 1000AA and display pads 110. The protruding portions 450a may each extend from the sensing pads 440a toward the edge 200ea.

Hereinafter, although the display panel will be described with reference to FIG. 1A, the descriptions may also be applied to the display panel 1000a of FIG. 2, in which the sensing pads 440a are disposed adjacent to the edge 200ea.

Figure 3:
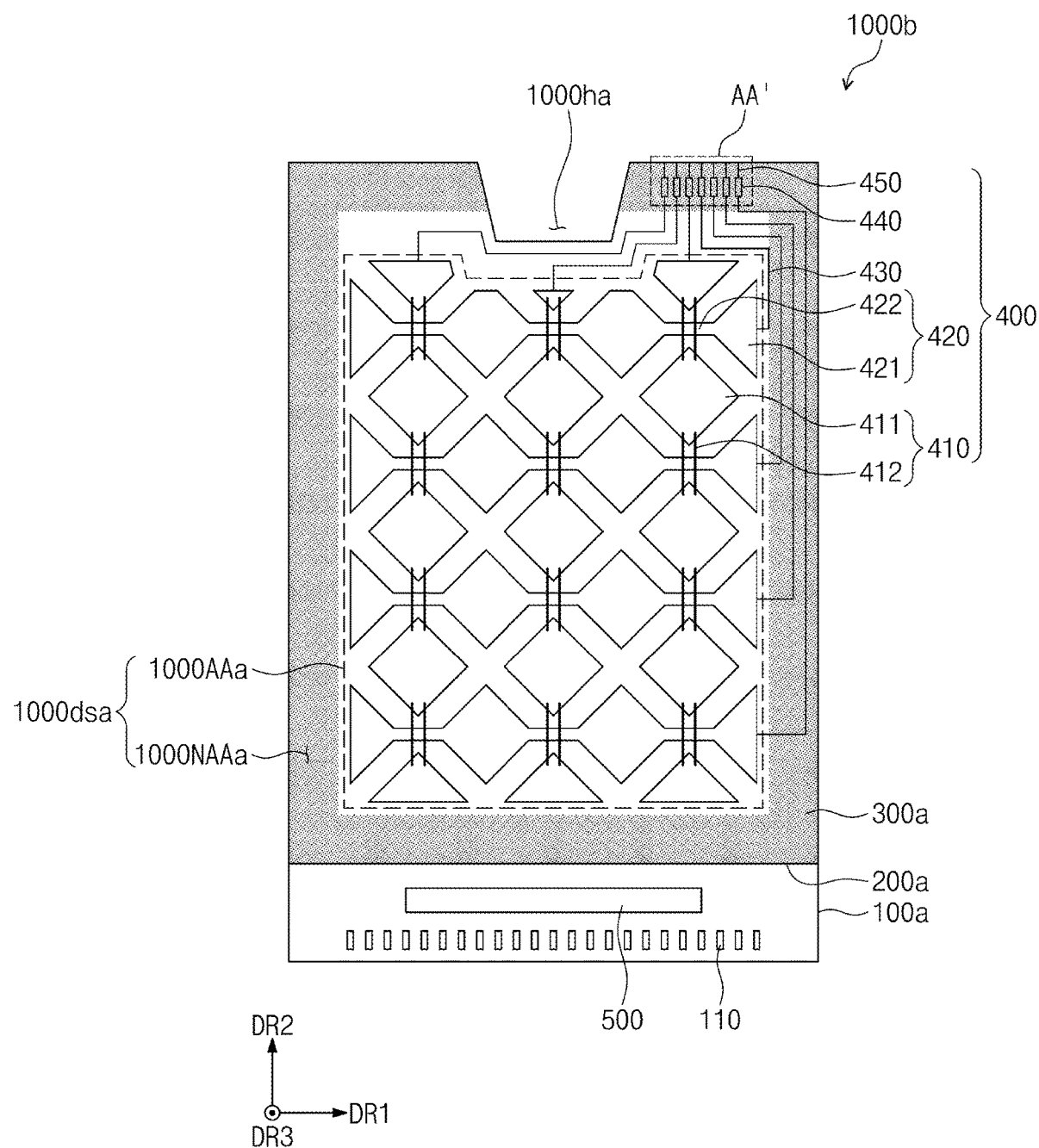
FIG. 3 is a plan view illustrating a display panel according to an embodiment.

FIG. 3 is a plan view illustrating a display panel according to an embodiment.

Referring to FIG. 3, a display panel 1000b may include a first substrate 100a, a second substrate 200a, a coupling member 300a, a sensor 400, and a driving chip 500. The display panel 1000b may have a shape different from that of the display panel 1000 in FIG. 1A. For example, according to the illustrated embodiment, a recessed portion 1000ha may be defined in each of the first substrate 100a and the second substrate 200a. The recessed portion 1000ha may be recessed concavely from a side surface of each of the first substrate 100a and the second substrate 200a. The display panel 1000b in FIG. 3 may be referred to as a notch-type display panel or an atypical display panel. An electronic module such as a camera module or an infrared sensor may be disposed in the recessed portion 1000ha.

In a display surface 1000dsa, a display area 1000AAa and a non-display area 1000NAAa may be defined. While the display area 1000AA in FIG. 1A has a rectangular shape, the display area 1000AAa in FIG. 3 may have a shape in which a portion is recessed. As illustrated in FIG. 3, the shape of the display area 1000AAa may be referred to as a notch shape or atypical shape.

Figure 4:
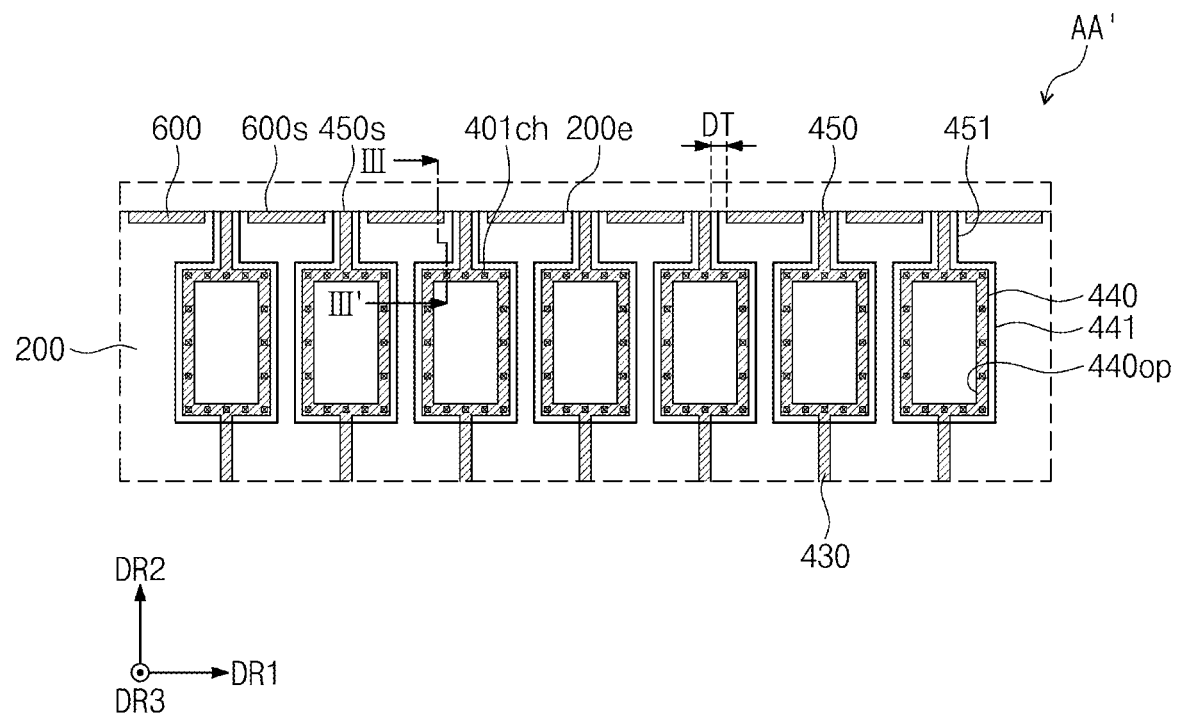
FIG. 4 is an enlarged plan view of area AA' shown in FIG. 1A according to an embodiment.
Figure 5:
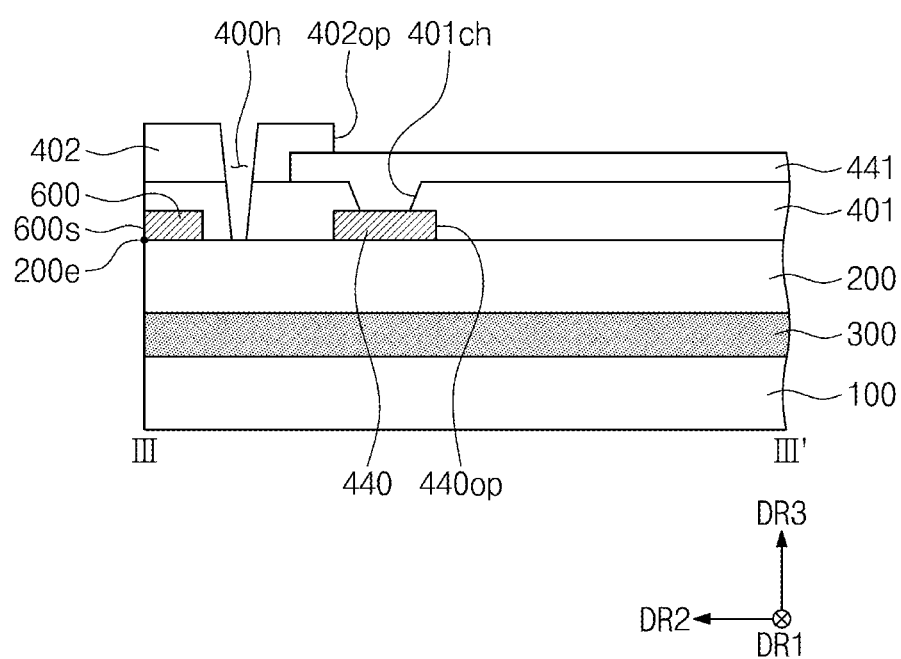
FIG. 5 is a cross-sectional view taken along line of FIG. 4 according to an embodiment.

FIG. 4 is an enlarged plan view of area AA' shown in FIG. 1A according to an embodiment. FIG. 5 is a cross-sectional view taken along line of FIG. 4.

Referring to FIGS. 1A, 4, and 5, the display panel 1000 may further include a light shielding pattern 600. The light shielding pattern 600 may be provided in plurality. The light shielding patterns 600 may be disposed on the second substrate 200. The light shielding patterns 600 may be disposed adjacent to the edge 200e of the second substrate 200. Each of the light shielding patterns 600 may have a side surface 600s that coincides with the edge 200e of the second substrate 200. The side surface 600s of each of the light shielding patterns 600 may be aligned with the edge 200e. The side surface 600s of each of the light shielding patterns 600 may overlap the edge 200e of the second substrate 200.

The protruding portions 450 may extend from the sensing pads 440, respectively, to the edge 200e of the second substrate 200. Thus, each of the protruding portions 450 may have a side surface 450s that coincides with the edge 200e of the second substrate 200. The side surface 450s of each of the protruding portions 450 may be aligned with the edge 200e. The side surface 450s of each of the protruding portions 450 may overlap the edge 200e of the second substrate 200. The light shielding patterns 600 may be disposed between the protruding portions 450. The light shielding patterns 600 may be spaced apart from the protruding portions 450. A distance DT between the light shielding patterns 600 and the protruding portions 450 may be equal to or less than a predetermined distance. For example, a distance DT between adjacent ones of light shielding pattern 600 and the protruding portion 450 may be equal to or less than about 4 μm and greater than about 0 μm.

The light shielding patterns 600 may be provided to block a laser in the process of melting the coupling member 300 to couple the first substrate 100 and the second substrate 200. When the distance DT is greater than about 4 μm, an effect of blocking the laser may be reduced. As such, the distance DT between adjacent ones of light shielding pattern 600 and the protruding portion 450 may be equal to or less than about 4 μm.

When the light shielding patterns 600 are connected to the protruding portions 450, adjacent protruding portions 450 may be electrically connected by the light shielding pattern 600 to cause a short-circuit failure. As such, the light shielding patterns 600 may be spaced apart from the protruding portions 450.

The sensing pads 440, the protruding portions 450, and the light shielding patterns 600 may include the same material and provided through the same process as each other. For example, each of the sensing pads 440, the protruding portions 450, and the light shielding patterns 600 may be disposed on the same layer as the bridge pattern 412.

When the sensing pads 440 include opaque metal, the laser irradiated toward the coupling member 300 to melt the coupling member 300 may be blocked by the sensing pads 440. As such, an opening 440op may be defined in each of the sensing pads 440 to prevent blockage of the laser.

The sensing insulation layer 401 may be disposed on the second substrate 200 to cover the sensing pads 440, the protruding portions 450, and the light shielding patterns 600.

A transparent conductive layer may be disposed on the sensing insulation layer 401. The transparent conductive layer may include the first portions 421, the second portion 422, and the sensing patterns 411, which have been described above. Also, the transparent conductive layer may further include pad portions 441 and additional protruding portions 451. The pad portions 441 may be disposed on the sensing pads 440, respectively. The pad portions 441 may be electrically connected to the sensing pads 440, respectively. For example, the pad portions 441 may contact the sensing pads 440, respectively, through a contact hole 401ch defined in the sensing insulation layer 401. The opening 440op of each of the sensing pads 440 may be covered by the pad portion 441.

The additional protruding portions 451 may be disposed on the protruding portions 450, respectively. The additional protruding portions 451 may extend from the pad portions 441, respectively. The additional protruding portions 451 may extend from the pad portions 441, respectively, to the edge 200e of the second substrate 200.

The cover insulation layer 402 may be disposed on the sensing insulation layer 401 to cover a portion of the transparent conductive layer. The opening 402op may be defined in the cover insulation layer 402, and the pad portions 441 may be exposed by the opening 402op.

A cutting hole 400h may be defined in the sensing insulation layer 401 and the cover insulation layer 402. The cutting hole 400h may be provided by removing a portion of each of the sensing insulation layer 401 and the cover insulation layer 402.

Figure 6:
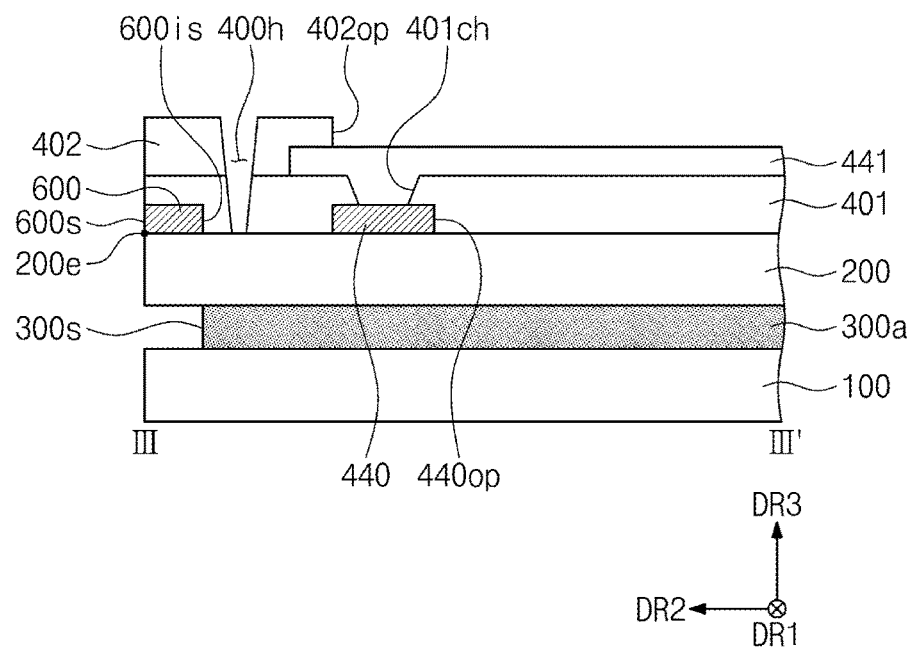
FIG. 6 is a cross-sectional view taken along line of FIG. 4 according to an embodiment.

FIG. 6 is a cross-sectional view taken along line of FIG. 4. The coupling member 300a according to the illustrated embodiment as shown in FIG. 6 may have a side surface 300s indented inwardly to be spaced apart from the side surface of the first substrate 100, unlike the coupling member 300 shown in FIG. 5.

Referring to FIG. 6, an inside surface 600is opposing the side surface 600s may be further defined in the light shielding patterns 600. The side surface 600s of each of the light shielding patterns 600 may be aligned with the edge 200e of the second substrate 200. The inside surface 600is of each of the light shielding patterns 600 may be aligned with the side surface 300s of the coupling member 300a. The inside surface 600is of each of the light shielding patterns 600 may overlap the side surface 300s of the coupling member 300a when viewed in a thickness direction of the second substrate 200, e.g., when viewed in the third direction DR3.

The light shielding patterns 600 may be provided to block a laser in the process of melting the coupling member 300a to couple the first substrate 100 and the second substrate 200. A coupling force of one portion of the coupling member 300a provided in an area overlapping the light shielding patterns 600 may be less than that of another portion of the coupling member 300a provided in an area that is not overlapped with the light shielding patterns 600. As such, the one portion of the coupling member 300a may be removed during the process of manufacturing the display panel 1000 (refer to FIG. 1A), and thus, the inside surface 600is of each of the light shielding patterns 600 may be aligned with the side surface 300s of the coupling member 300a.

Figure 7:
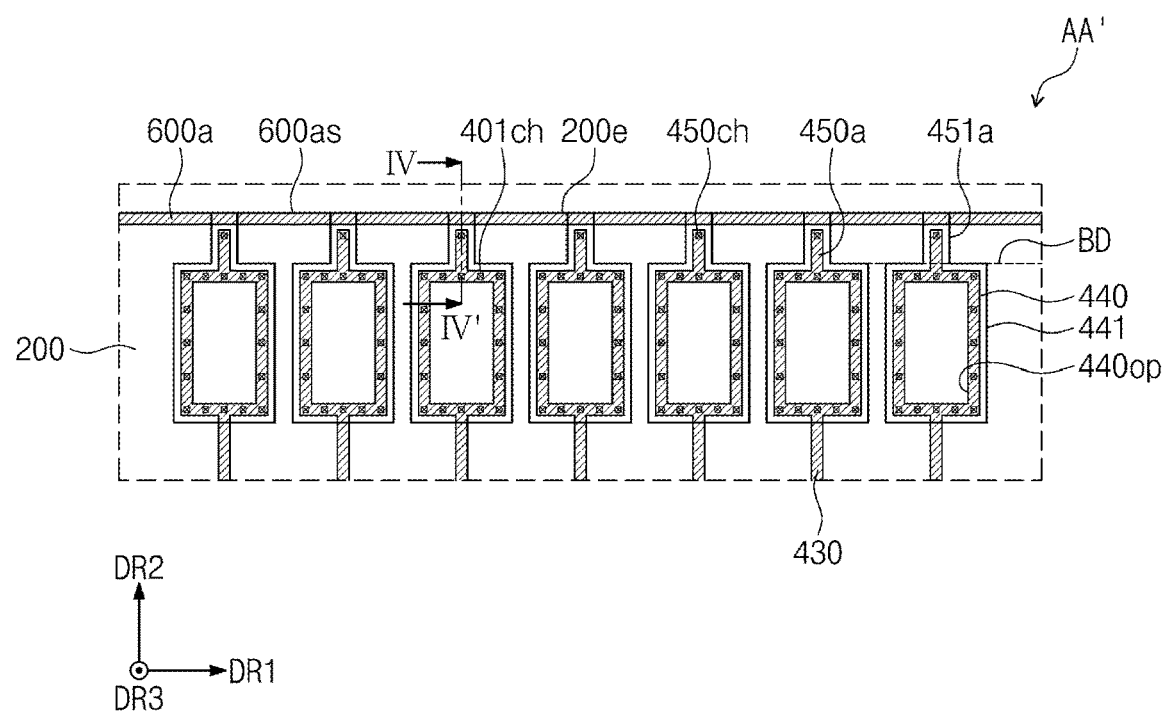
FIG. 7 is an enlarged plan view of area AA' shown in FIG. 1A according to an embodiment.
Figure 8:
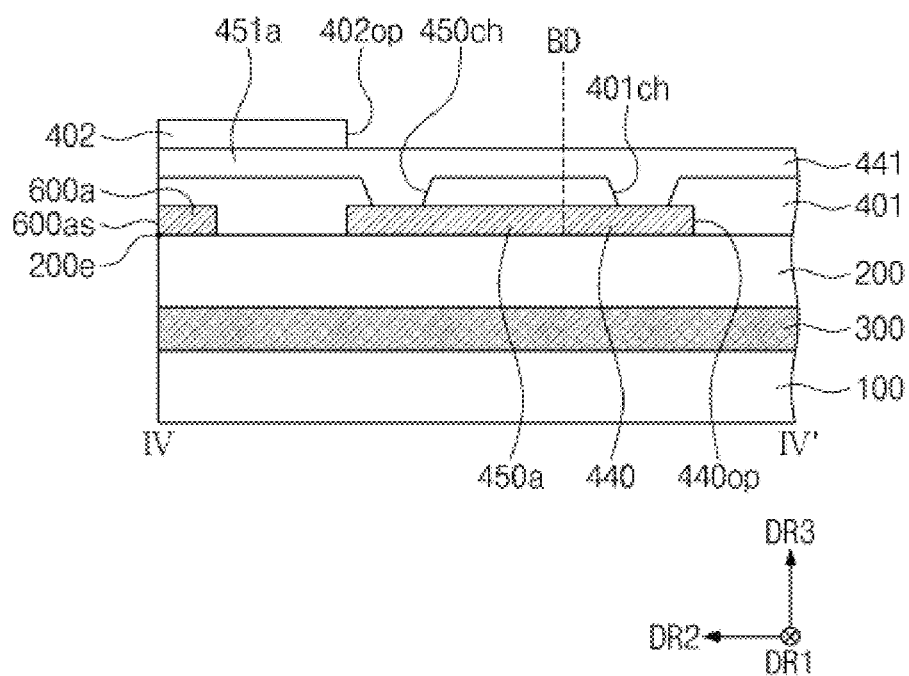
FIG. 8 is a cross-sectional view taken along line IV-IV' of FIG. 7.

FIG. 7 is an enlarged plan view of area AA' shown in FIG. 1A according to an embodiment. FIG. 8 is a cross-sectional view taken along line IV-IV' of FIG. 7.

Referring to FIGS. 1A, 7, and 8, the display panel 1000 according to the illustrated embodiment may further include a light shielding pattern 600a. The light shielding pattern 600a may be disposed on the second substrate 200. The light shielding pattern 600a may be disposed adjacent to the edge 200e of the second substrate 200. The light shielding pattern 600a may have a side surface 600as aligned with the edge 200e.

The light shielding pattern 600a may extend along an extension direction of the edge 200e. For example, the light shielding pattern 600a may extend in the first direction DR1.

Each of the protruding portions 450a may extend from each of the sensing pads 440 to the edge 200e of the second substrate 200. As such, each of the protruding portions 450a may be spaced apart from the edge 200e with the light shielding pattern 600a therebetween.

The display panel 1000 may further include bridge patterns 451a connected to the protruding portions 450a, respectively. The bridge patterns 451a may contact the protruding portions 450a, respectively, through a contact hole 450ch defined in the sensing insulation layer 401. The bridge patterns 451a may extend from the protruding portions 450a, respectively, to the edge 200e of the second substrate 200 and overlap the light shielding pattern 600a.

The protruding portions 450a may be disposed on the same layer as the sensing pads 440 and include the same material as the sensing pads 440. The protruding portions 450a may be integrated with the sensing pads 440, respectively. The bridge patterns 451a may be disposed on the same layer as the pad portions 441, and include the same material as the pad portions 441. The bridge patterns 451a may be integrated with the pad portions 441, respectively.

A boundary BD between one bridge pattern 451a and one pad portion 441 may have a varied width in the first direction DR1, and a boundary between one protruding portion 450a and one sensing pad 440 may overlap the boundary BD.

Figure 9A:
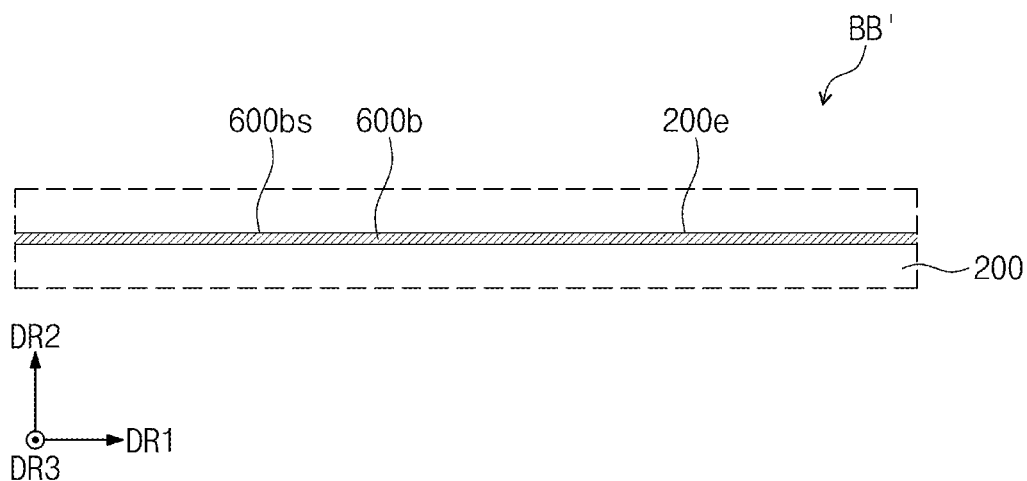
FIG. 9A is an enlarged plan view of area BB' shown in FIG. 1A according to an embodiment.

FIG. 9A is an enlarged plan view of area BB' shown in FIG. 1A according to an embodiment.

Referring to FIGS. 1A and 9A, a light shielding pattern 600b is disposed on an area spaced apart from the protruding portions 450 in the first direction DR1. The light shielding pattern 600*b* may have a continuous shape in the area spaced apart from the protruding portions 450.

The light shielding pattern 600*b* may extend in the same direction as the extension direction of the edge 200*e* of the second substrate 200, and have a side wall 600*bs* aligned with the edge 200*e* of the second substrate 200.

Figure 9B:
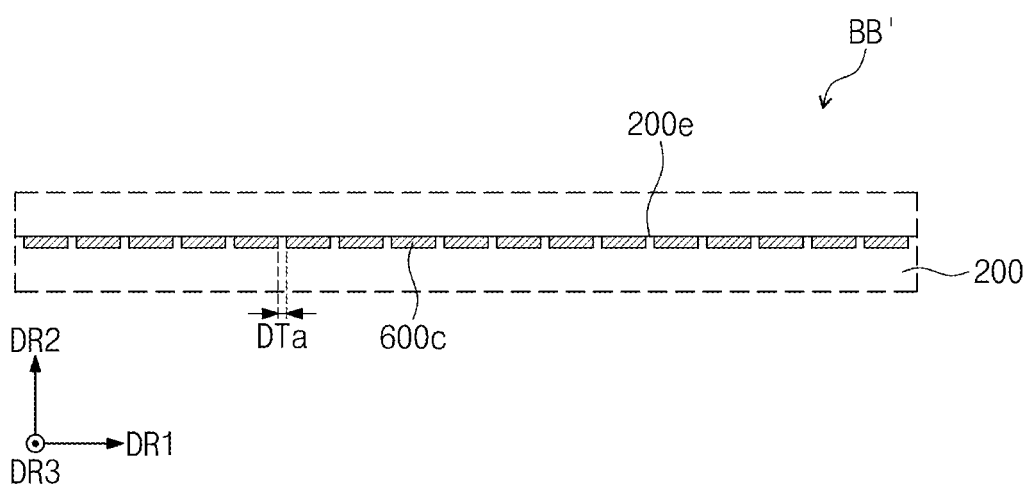
FIG. 9B is an enlarged plan view of area BB' shown in FIG. 1A according to an embodiment.

FIG. 9B is an enlarged plan view of area BB' shown in FIG. 1A according to an embodiment.

Referring to FIGS. 1A and 9B, light shielding patterns 600*c* according to the illustrated embodiment is disposed on an area spaced apart from the protruding portions 450. The light shielding patterns 600*c* may be spaced apart from each other. A distance DTa between adjacent light shielding patterns 600 may be equal to or less than about 4 μm and greater than about 0 μm.

The light shielding patterns 600*c* may be provided to block a laser in the process of melting the coupling member 300 to couple the first substrate 100 and the second substrate 200. When the distance DTa is greater than about 4 μm, an effect of blocking the laser may be reduced. As such, the distance DTa may be limited equal to or less than about 4 μm.

Figure 10:
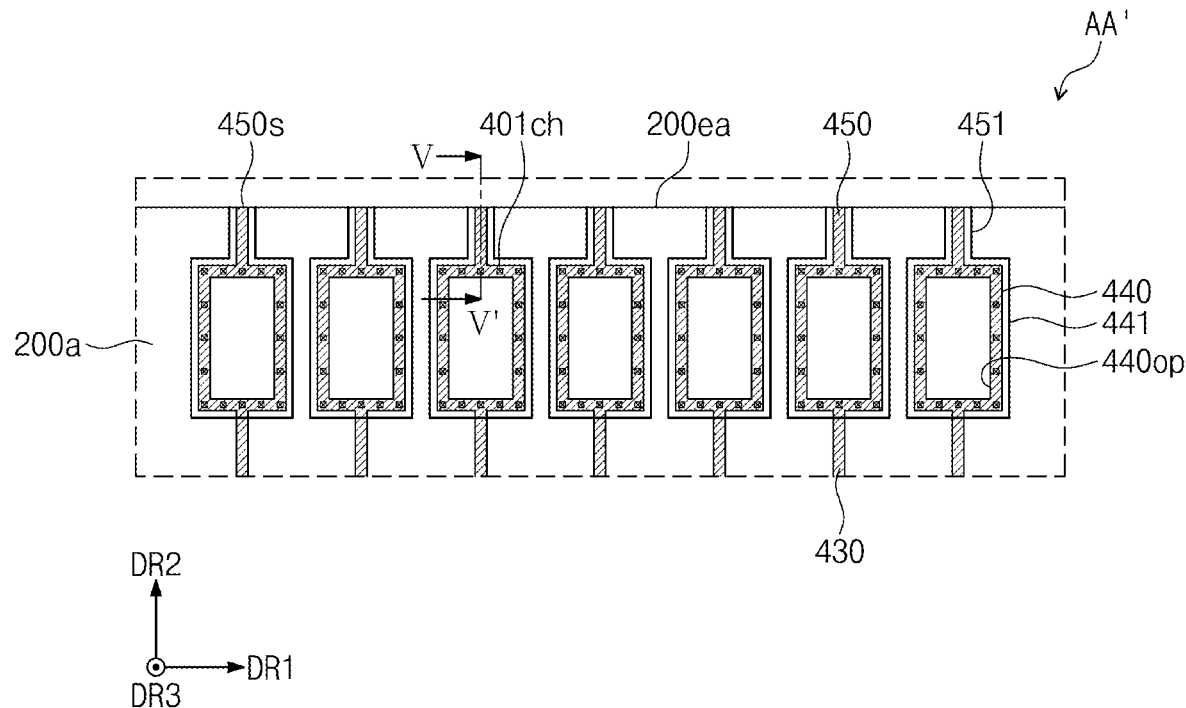
FIG. 10 is an enlarged plan view of area AA' shown in FIG. 1A according to an embodiment.
Figure 11:
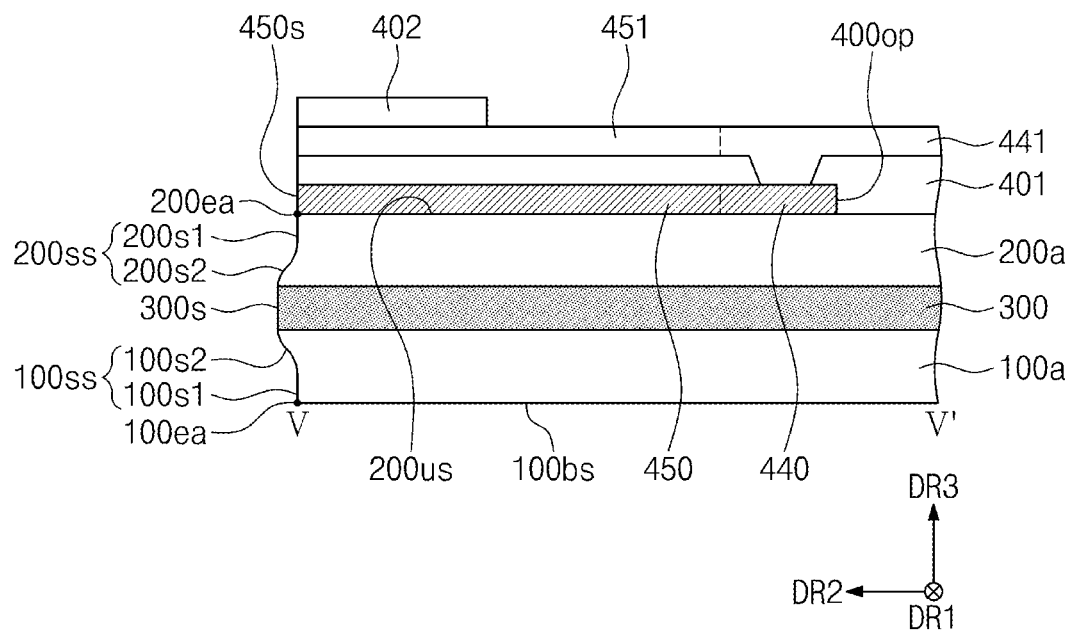
FIG. 11 is a cross-sectional view taken along line V-V of FIG. 10.

FIG. 10 is an enlarged plan view of area AA' shown in FIG. 1A according to an embodiment of the inventive concept. FIG. 11 is a cross-sectional view taken along line V-V' of FIG. 10.

Referring to FIGS. 1A, 10, and 11, the display panel 1000 according to the illustrated embodiment may include a first substrate 100*a* and a second substrate 200*a*. The first substrate 100*a* and the second substrate 200*a* may be coupled by the coupling member 300.

The second substrate 200*a* may have a top surface 200*us* and a side surface 200*ss*. The top surface 200*us* may be parallel to a plane defined by the first direction DR1 and the second direction DR2. The side surface 200*ss* may extend from the top surface 200*us* to the first substrate 100*a*. A boundary 200*ea* between the top surface 200*us* and the side surface 200*ss* may be referred to as an edge.

The side surface 200*ss* may include a first side portion 200*s*1 extending from the boundary 200*ea* and a second side portion 200*s*2 extending from the first side portion 200*s*1 to a side surface 300*s* of the coupling member 300.

When viewed in a thickness direction of the second substrate 200*a*, the second side portion 200*s*2 may protrude further than the first side portion 200*s*1 from the boundary 200*ea*. For example, the first side portion 200*s*1 may be a portion cut by a cutting process, and the second side portion 200*s*2 may be a portion that may be generated by a crack or the like, which extends in a direction from the first side portion 200*s*1 to the side surface 300*s* of the coupling member 300.

The first substrate 100*a* may have a bottom surface 100*bs* and a side surface 100*ss*. The bottom surface 100*bs* may be parallel to the plane defined by the first direction DR1 and the second direction DR2. The side surface 100*ss* may extend from the bottom surface 100*bs* to the second substrate 200*a*. A boundary 100*ea* between the bottom surface 100*bs* and the side surface 100*ss* may be referred to as an edge.

The side surface 100*ss* may include a first side portion 100*s*1 extending from the boundary 100*ea* and a second side portion 100*s*2 extending from the first side portion 100*s*1 to the side surface 300*s* of the coupling member 300.

When viewed in a thickness direction of the first substrate 100*a*, the second side portion 100*s*2 may protrude further than the first side portion 100*s*1 from the boundary 100*ea*. For example, the first side portion 100*s*1 may be a portion cut by a cutting process, and the second side portion 100*s*2 may be a portion that may be generated by a crack or the like, which extends in a direction from the first side portion 100*s*1 to the side surface 300*s* of the coupling member 300.

According to an embodiment, each of the second side portion 100*s*2 of the first substrate 100*a*, the side surface 300*s* of the coupling member 300, and the second side portion 200*s*2 of the second substrate 200*a* may protrude further than each of the first side portion 100*s*1 of the first substrate 100*a* and the first side portion 200*s*1 of the second substrate 200*a*. More particularly, both of the first substrate 100*a* and the second substrate 200*a* may include the protruding portion. In this case, an impact applied from the outside may be evenly distributed to the first substrate 100*a*, the second substrate 200*a*, and the coupling member 300. As such, the display panel 1000 may have improved strength against an external impact and improved reliability.

Figure 12:
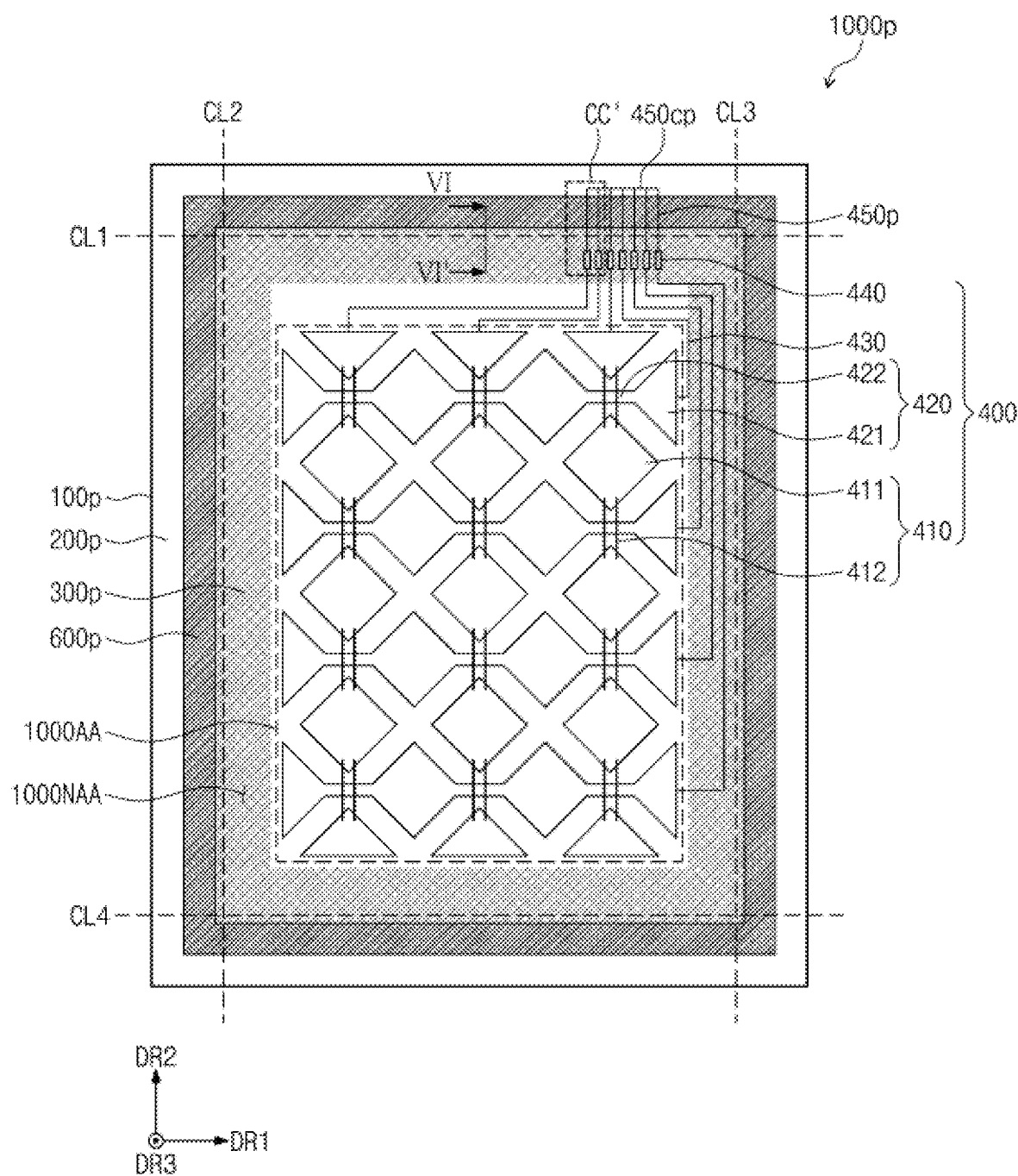
FIG. 12 is a plan view illustrating a display panel according to an embodiment.

FIG. 12 is a plan view illustrating a display panel according to an embodiment.

When a display panel 1000*p* in FIG. 12 is cut, the display panel 1000 shown in FIG. 1A may be provided. Hereinafter, the display panel will be described with reference to FIGS. 1A and 12. The display panel 1000*p* in FIG. 12 will be referred to as a preliminary display panel 1000*p* to be distinguished from the display panel 1000 in FIG. 1A.

The preliminary display panel 1000*p* may include a first preliminary substrate 100*p*, a second preliminary substrate 200*p*, a coupling member 300*p*, a sensor 400, a light shielding part 600*p*, and a connection portion 450*cp*.

The first substrate 100 may be obtained by cutting the first preliminary substrate 100*p*, and the second substrate 200 may be obtained by cutting the second preliminary substrate 200*p*. In FIG. 12, the first preliminary substrate 100*p* may have the substantially same area as the second preliminary substrate 200*p*, and the first preliminary substrate 100*p* may overlap the second preliminary substrate 200*p*.

The coupling member 300*p* may be disposed between the first preliminary substrate 100*p* and the second preliminary substrate 200*p* to couple the first preliminary substrate 100*p* and the second preliminary substrate 200*p*. As the coupling member 300*p* is melted when a laser is irradiated to the coupling member 300*p*, the first preliminary substrate 100*p* and the second preliminary substrate 200*p* may be bonded with each other.

The light shielding part 600*p* may be disposed on the second preliminary substrate 200*p*. The light shielding part 600*p* may overlap the coupling member 300*p*. The light shielding part 600*p* may have substantially a rectangular ring shape surrounding a display area 1000AA.

The light shielding part 600*p* may block a laser irradiated toward the coupling member 300*p*. As such, an edge of the coupling member 300 may be determined by the light shielding part 600*p* as shown in FIG. 1A. For example, a boundary between one portion of the coupling member 300*p* which overlaps the light shielding part 600*p*, and another portion of the coupling member 300*p* which does not overlap the light shielding part 600*p* may be the side surface 300*s* of the coupling member 300 (refer to FIG. 11).

Each of the first preliminary substrate 100*p* and the second preliminary substrate 200*p* may be cut along first to third cutting lines CL1, CL2, and CL3. The first cutting line CL1 may extend in the first direction DR1, and each of the second and third cutting lines CL2 and CL3 may extend in the second direction DR2.

The second preliminary substrate 200*p* may be additionally cut along a fourth cutting line CL4. The second preliminary substrate 200*p* and the coupling member 300*p* may be cut along the fourth cutting line CL4, and the display pads 110 disposed on the first preliminary substrate 100p may be exposed as shown in FIG. 1A.

As a distance between the first to third cutting lines CL1, CL2, and CL3 and the display area 1000AA decreases, a non-display area 1000NAA of the display panel 1000 may be gradually decreased. For example, each of the first to fourth cutting lines CL1, CL2, CL3, and CL4 may be defined in an area overlapping the coupling member 300p. As such, the display panel 1000 having a narrow bezel may be provided as shown in FIG. 1A.

According to an embodiment, each of the first to fourth cutting lines CL1, CL2, CL3, and CL4 may be defined adjacent to the light shielding part 600p. For example, each of the first to fourth cutting lines CL1, CL2, CL3, and CL4 may be defined at a predetermined distance from the light shielding part 600p towards the display area 1000AA.

Each of the protruding portions 450p may extend in a direction passing through the first cutting line CL1 and away from the display area 1000AA. The protruding portions 450p may be electrically connected by the connection portion 450cp. The connection portion 450cp may be referred to as a shorting bar. The connection portion 450cp may be used to test an operation of the sensor 400. In addition, the connection portion 450cp may prevent electrostatic discharge generated during the process of manufacturing the display panel 1000. In this manner, a breakage of an insulation layer or melting of a line caused by static electricity may be prevented.

A portion of the light shielding part 600p extending in the first direction DR1 may be disposed between the connection portion 450cp and the sensing pads 440. The protruding portions 450p may each extend in the second direction DR2 while being spaced apart from each other in the first direction DR1. When viewed in a thickness direction of the second preliminary substrate 200p, the light shielding part 600p may have a shape crossing the protruding portions 450p.

Figure 13:
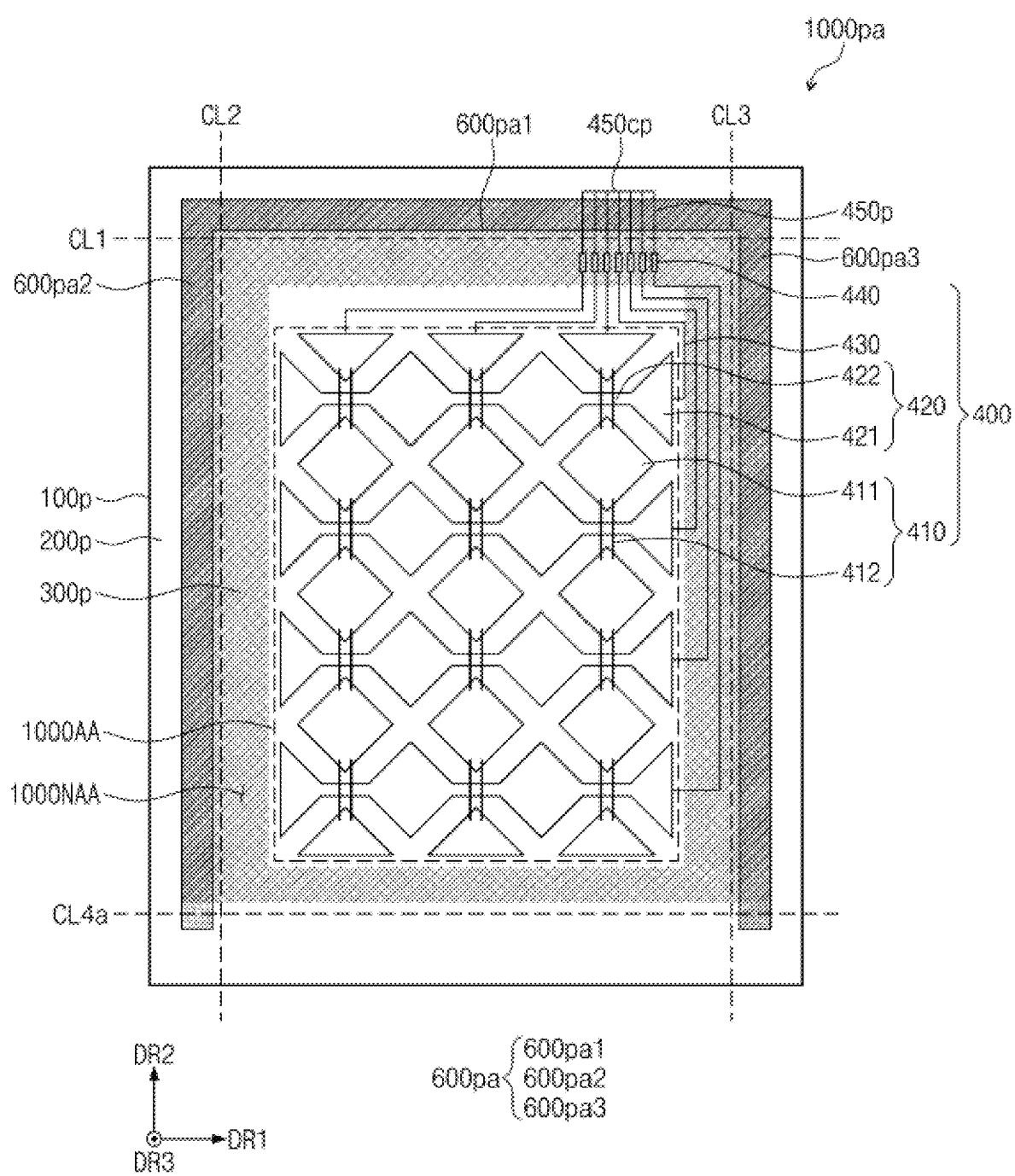
FIG. 13 is a plan view illustrating a display panel according to an embodiment.

FIG. 13 is a plan view illustrating a display panel according to an embodiment.

Referring to FIG. 13, a light shielding part 600pa of a preliminary display panel 1000pa according to the illustrated embodiment may have a shape different from that of the light shielding part 600p of the preliminary display panel 1000p shown in FIG. 12. More particularly, the light shielding part 600pa may have a shape surrounding only a portion of a display area 1000AA. For example, the light shielding part 600pa may include a first light shielding portion 600pa1 extending in the first direction DR1, a second light shielding portion 600pa2 extending from one end of the first light shielding portion 600pa1 in the second direction DR2, and a third light shielding portion 600pa3 extending from the other end of the first light shielding portion 600pa1 in the second direction DR2.

A first cutting line CL1 may be defined adjacent to the first light shielding portion 600pa1 and overlap a coupling member 300p. A second cutting line CL2 may be defined adjacent to the second light shielding portion 600pa2 and overlap the coupling member 300p. A third cutting line CL3 may be defined adjacent to the third light shielding portion 600pa3 and overlap the coupling member 300p.

An area of the display panel 1000 shown in FIG. 1A may be determined by a position of each of the first to third cutting lines CL1, CL2, and CL3 when viewed in the third direction DR3. In particular, as a distance between the first to third cutting lines CL1, CL2, and CL3 and the display area 1000AA decreases, a narrow bezel may be realized. As such, the first to third cutting lines CL1, CL2, and CL3 may be defined to overlap the coupling member 300p.

A fourth cutting line CL4a may be a line for cutting only a second preliminary substrate 200p, and a portion of the first preliminary substrate 100p corresponding to the fourth cutting line CL4a may not be cut. In this case, although a distance between the fourth cutting line CL4a and the display area 1000AA may be increased, the area of the display panel 1000 when viewed in the third direction DR3 as shown in FIG. 1A may not be increased. As such, the fourth cutting line CL4a may be defined in an area that is not overlapped with the coupling member 300p.

Figure 14:
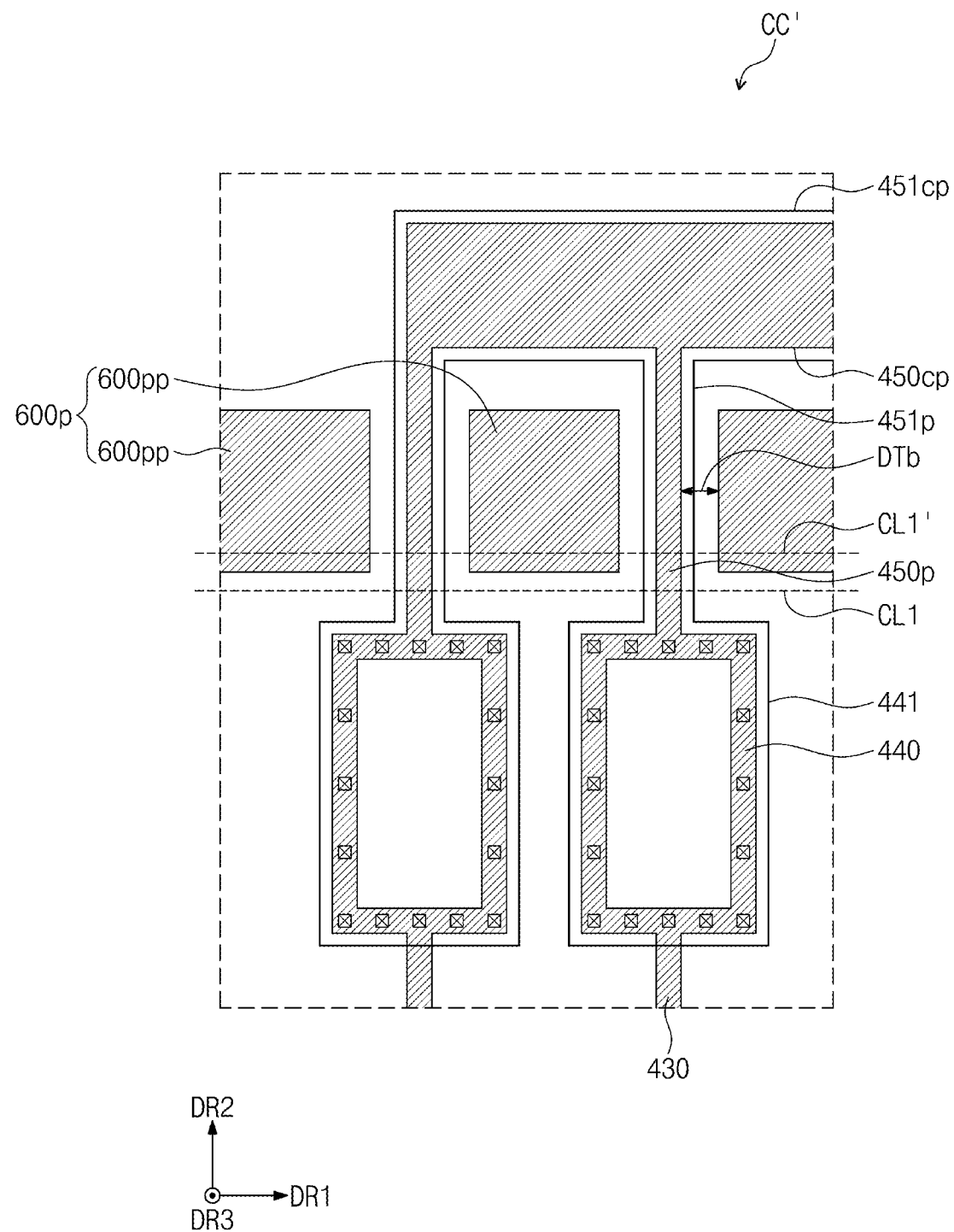
FIG. 14 is an enlarged plan view of area CC' shown in FIG. 12 according to an embodiment.

FIG. 14 is an enlarged plan view of area CC' shown in FIG. 12 according to an embodiment.

Referring to FIGS. 12 and 14, the light shielding part 600p may include a plurality of light shielding patterns 600pp (hereinafter, referred to as light shielding patterns). The light shielding patterns 600pp may be spaced apart from protruding portions 450p. A distance DTb between one light shielding pattern 600pp and one protruding portion 450p that are adjacent to each other may be equal to or less than about 4 μm and greater than about 0 μm.

Although FIG. 14 exemplarily illustrates that the first cutting line CL1 is defined between the light shielding part 600p and the sensing pads 440, a position of the first cutting line CL1 may be varied by a process deviation. For example, in some embodiments, a position of a first cutting line CL1' may overlap the light shielding part 600p. In this case, a portion of each of the light shielding patterns 600pp may be retained in the display panel 1000 that has been cut as shown in FIG. 1A.

According to an embodiment, although a portion of each of the light shielding patterns 600pp is remained in the display panel 1000, a short-circuit failure between the protruding portions 450p may not be generated because the light shielding patterns 600pp are spaced apart from the protruding portions 450p by the distance DTb. As such, the display panel 1000 according to an embodiment may have improved manufacturing yield and reliability.

A plurality of additional protruding portions 451p (hereinafter, referred to as additional protruding portions) may extend from pad portions 441, respectively, in a direction passing through the first cutting line CL1 and away from the display area 10000AA. The additional protruding portions 451p may be electrically connected to each other by an additional connection portion 451cp.

The additional protruding portions 451p may be disposed to correspond to positions of the protruding portions 450p, respectively, and the additional connection portion 451cp may be disposed to correspond to a position of a connection portion 450cp. For example, the additional protruding portions 451p and the additional connection portion 451cp may be disposed on the same layer as the first portions 421, the second portion 422, and the sensing patterns 411, and the protruding portions 450p and the connection portion 450cp may be disposed on the same layer as the bridge pattern 412. In some embodiments, the additional protruding portions 451p and the additional connection portion 451cp may be omitted.

Figure 15:
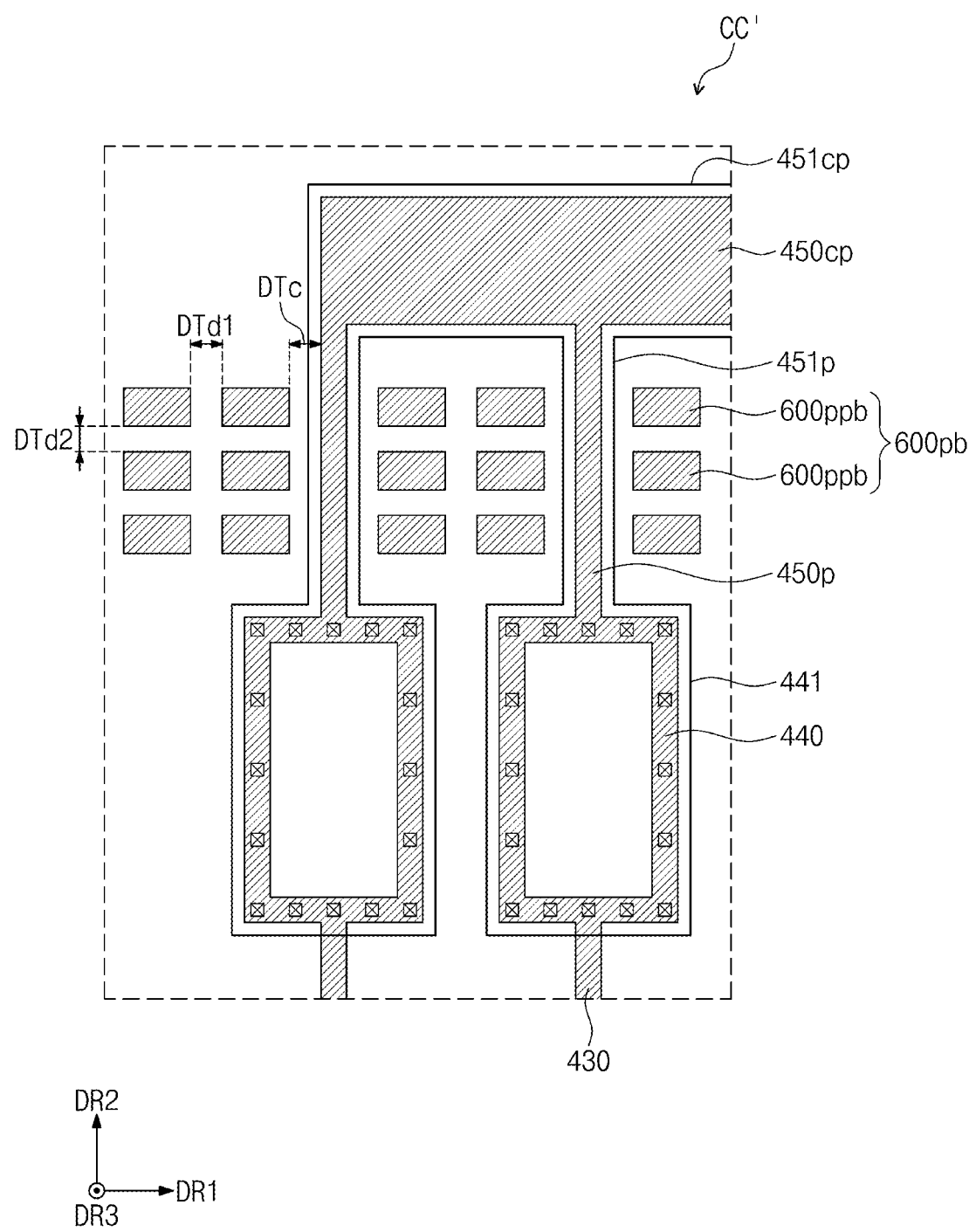
FIG. 15 is an enlarged plan view of area CC' shown in FIG. 12 according to an embodiment.

FIG. 15 is an enlarged plan view of area CC' shown in FIG. 12 according to an embodiment.

Referring to FIGS. 12 and 15, a light shielding part 600pb according to the illustrated embodiment may include light shielding patterns 600ppb. The light shielding patterns 600ppb may be spaced apart from protruding portions 450p. A distance DTc between one light shielding pattern 600ppb and one protruding portion 450p that are adjacent to each other may be equal to or less than about 4 μm and greater than about 0 μm.

The light shielding patterns 600ppb may be spaced apart from each other in the first direction DR1 and the second direction DR2. Each of distances DTd1 and DTd2 between the light shielding patterns 600ppb may be equal to or less than about 4 μm and greater than about 0 μm.

In FIG. 15, at least two light shielding patterns 600ppb, which are spaced apart from each other in the first direction DR1, may be disposed between two mutually adjacent protruding portions 450p. As such, even when one of the light shielding patterns 600ppb is electrically connected to one protruding portion 450p, the two mutually adjacent protruding portions 450p may not be connected to each other.

Figure 16:
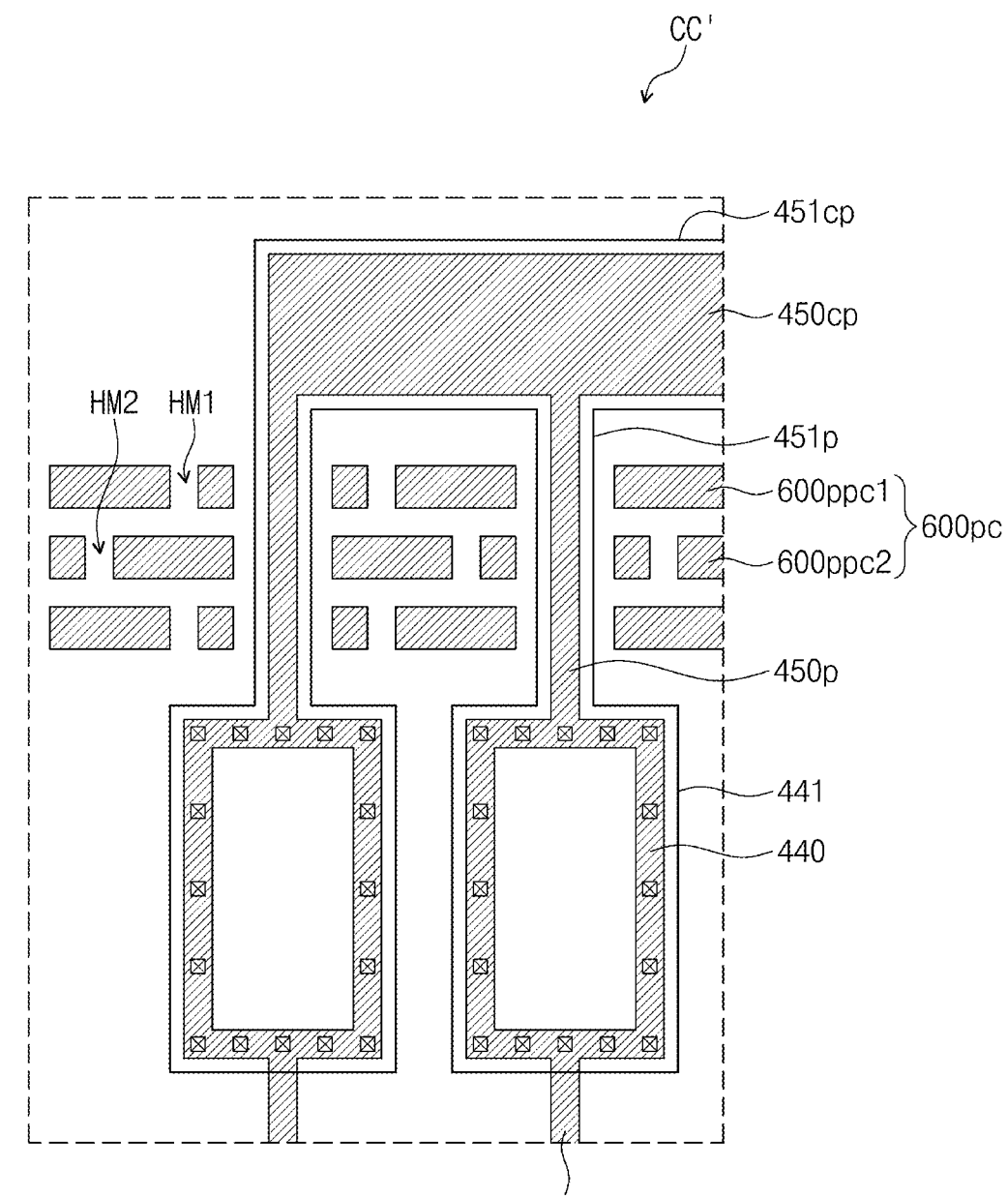
FIG. 16 is an enlarged plan view of area CC' shown in FIG. 12 according to an embodiment.

FIG. 16 is an enlarged plan view of area CC' shown in FIG. 12 according to an embodiment.

Referring to FIGS. 12 and 16, a light shielding part 600pc according to the illustrated embodiment may include light shielding patterns 600ppc1 and 600ppc2. The light shielding patterns 600ppc1 and 600ppc2 may be spaced apart from protruding portions 450p. The light shielding patterns 600ppc1 and 600ppc2 may include first light shielding patterns 600ppc1 and second light shielding patterns 600ppc2.

The first light shielding patterns 600ppc1 may be spaced apart from the second light shielding patterns 600ppc2 in the second direction DR2. The first light shielding patterns 600ppc1 may be arranged in the first direction DR1, and the second light shielding patterns 600ppc2 may be arranged in the first direction DR1.

A first gap HM1 may be defined between the first light shielding patterns 600ppc1, and a second gap HM2 may be defined between the second light shielding patterns 600ppc2. When viewed in the second direction DR2, the first gap HM1 and the second gap HM2 may not overlap each other.

Figure 17A:
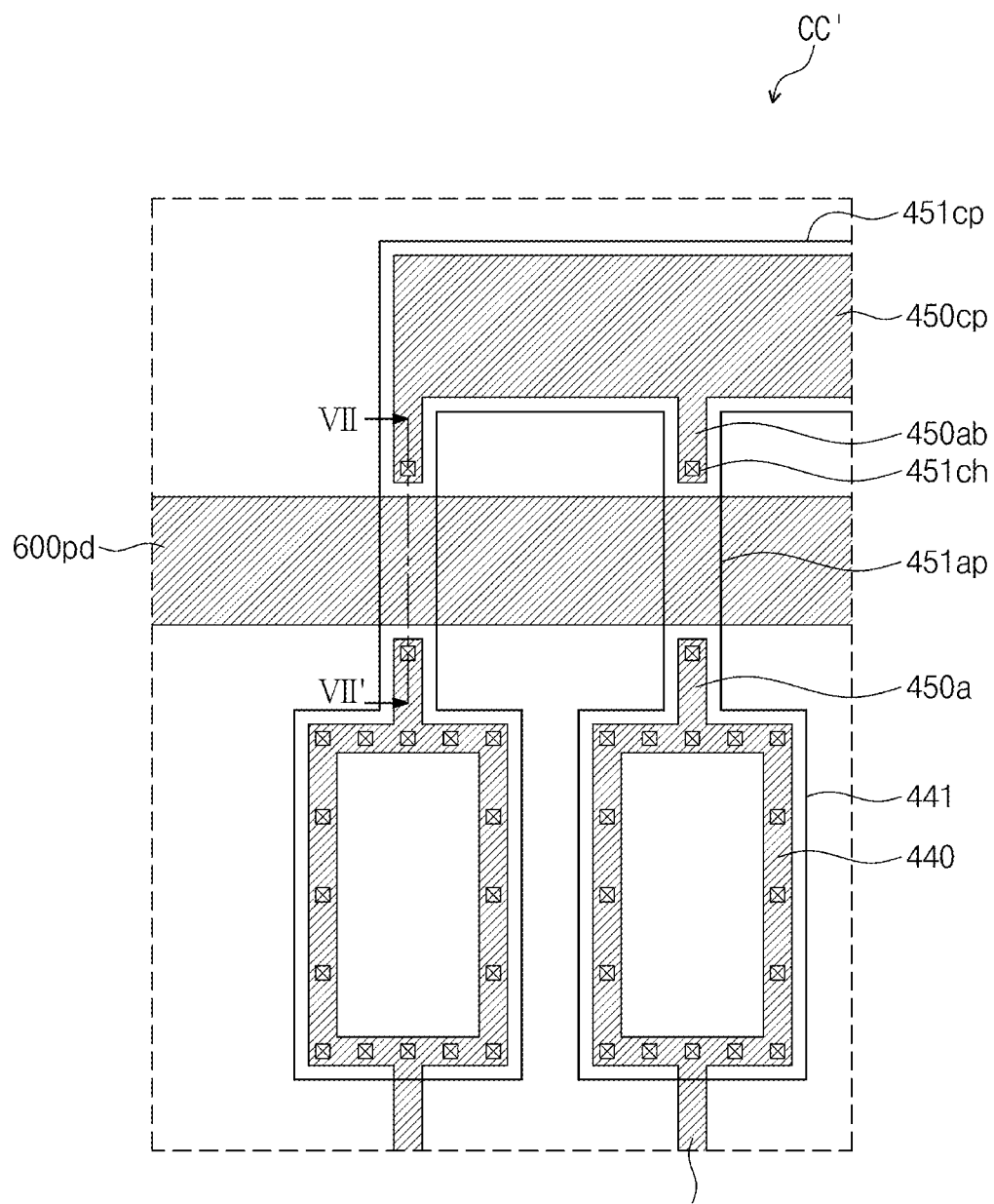
FIG. 17A is an enlarged plan view of area CC' shown in FIG. 12 according to an embodiment.
Figure 17B:
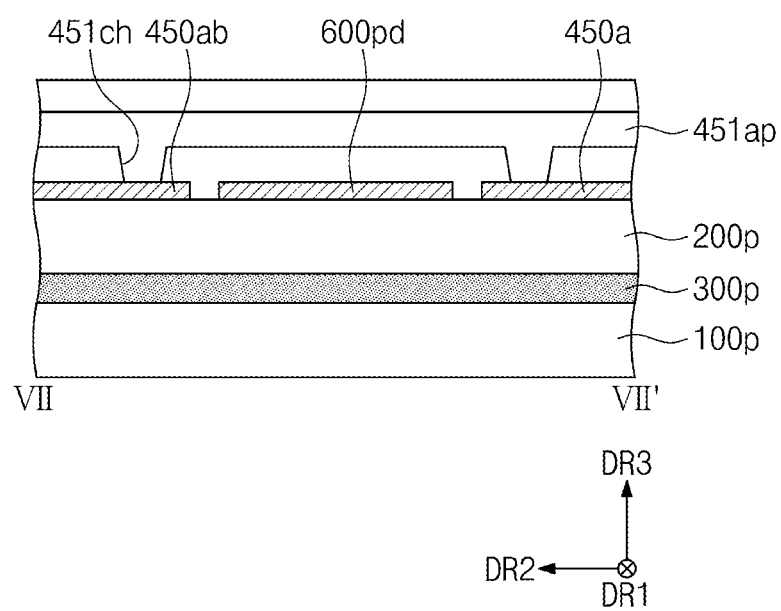
FIG. 17B is a cross-sectional view taken along line VII-VII' of FIG. 17A.

FIG. 17A is an enlarged plan view of area CC' shown in FIG. 12 according to an embodiment. FIG. 17B is a cross-sectional view taken along line VII-VII' of FIG. 17A.

Referring to FIGS. 17A and 17B, a light shielding part 600pd according to the illustrated embodiment may extend in the first direction DR1. When viewed in the third direction DR3, the light shielding part 600pd may be spaced apart from protruding portions 450a. Bridge patterns 451ap may be electrically connected to the protruding portions 450a, respectively, and may overlap the light shielding part 600pd.

The light shielding part 600pd and the protruding portions 450a, which are disposed on the same layer, may be spaced apart from each other, and the bridge patterns 451ap, which are disposed on a different layer, may overlap the light shielding part 600pd. The bridge patterns 451ap may be electrically connected to protruding portions 450ab, which protrude from a connection portion 450cp, through a contact hole 451ch, respectively. The bridge patterns 451ap may cross the light shielding part 600pd while being insulated therefrom.

The bridge patterns 451ap may be disposed on the same layer as the first portions 421 (refer to FIG. 1A), the second portion 422 (refer to FIG. 1A), and the sensing patterns 411 (refer to FIG. 1A). Each of the light shielding part 600pd, the protruding portions 450a, and the protruding portions 450ab may be disposed on the same layer as the bridge pattern 412 shown in FIG. 1A.

Figure 18:
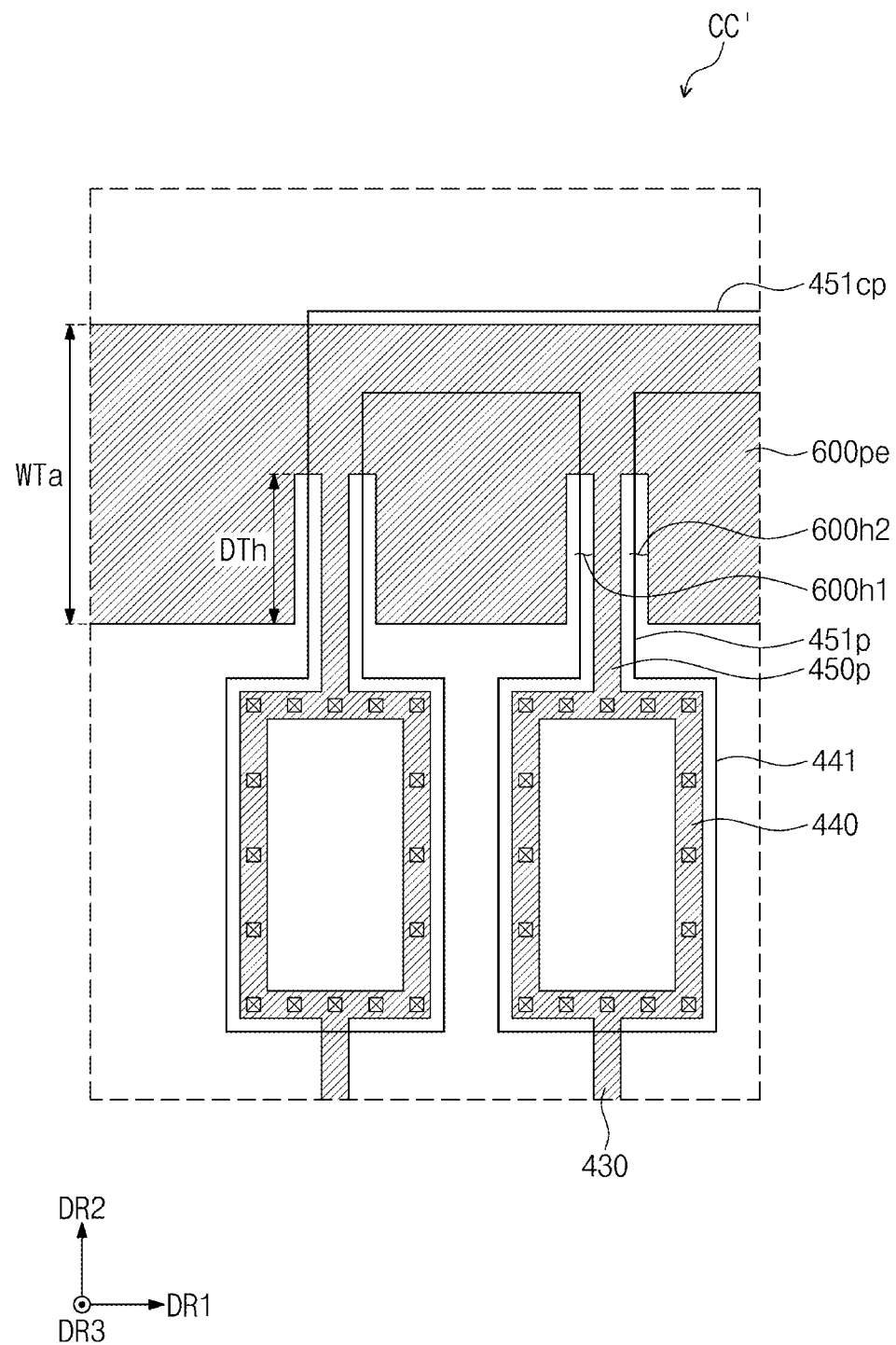
FIG. 18 is an enlarged plan view of area CC' shown in FIG. 12 according to an embodiment.

FIG. 18 is an enlarged plan view of area CC' shown in FIG. 12 according to an embodiment.

Referring to FIG. 18, a light shielding part 600pe may extend in the first direction DR1. The light shielding part 600pe may be connected to protruding portions 450p. As such, the connection portion 450cp shown in FIG. 14, which is disposed on the same layer as the light shielding part 600pe may be omitted.

A plurality of grooves 600h1 and 600h2 may be defined in the light shielding part 600pe. The plurality of grooves 600h1 and 600h2 may be defined adjacent to an area in which the protruding portions 450p cross the light shielding part 600pe. For example, the plurality of grooves 600h1 and 600h2 may be spaced apart from each other with one protruding portion 450p therebetween.

Each of the plurality of grooves 600h1 and 600h2 may extend in the second direction DR2. Each of the plurality of grooves 600h1 and 600h2 may have a length DTh in the second direction DR2 less than a width WTa in the second direction DR2 of the light shielding part 600pe.

As the protruding portions 450p are connected to each other by the light shielding part 600pe before the preliminary display panel 1000p is cut, electrostatic discharge that may be generated in the protruding portions 450p may be prevented. Also, since the plurality of grooves 600h1 and 600h2 are defined in the light shielding part 600pe, even when a portion of the light shielding part 600pe is retained after the preliminary display panel 1000p is cut, the retained light shielding part 600pe may not be connected to the protruding portions 450p.

Although FIG. 18 exemplarily illustrates that each of the plurality of grooves 600h1 and 600h2 extends in a linear form along the second direction DR2, the inventive concepts are not limited thereto. For example, in some embodiments, each of the plurality of grooves 600h1 and 600h2 may extend in a direction between the first direction DR1 and the second direction DR2 or extend in a zigzag form instead of the linear form.

Figure 19:
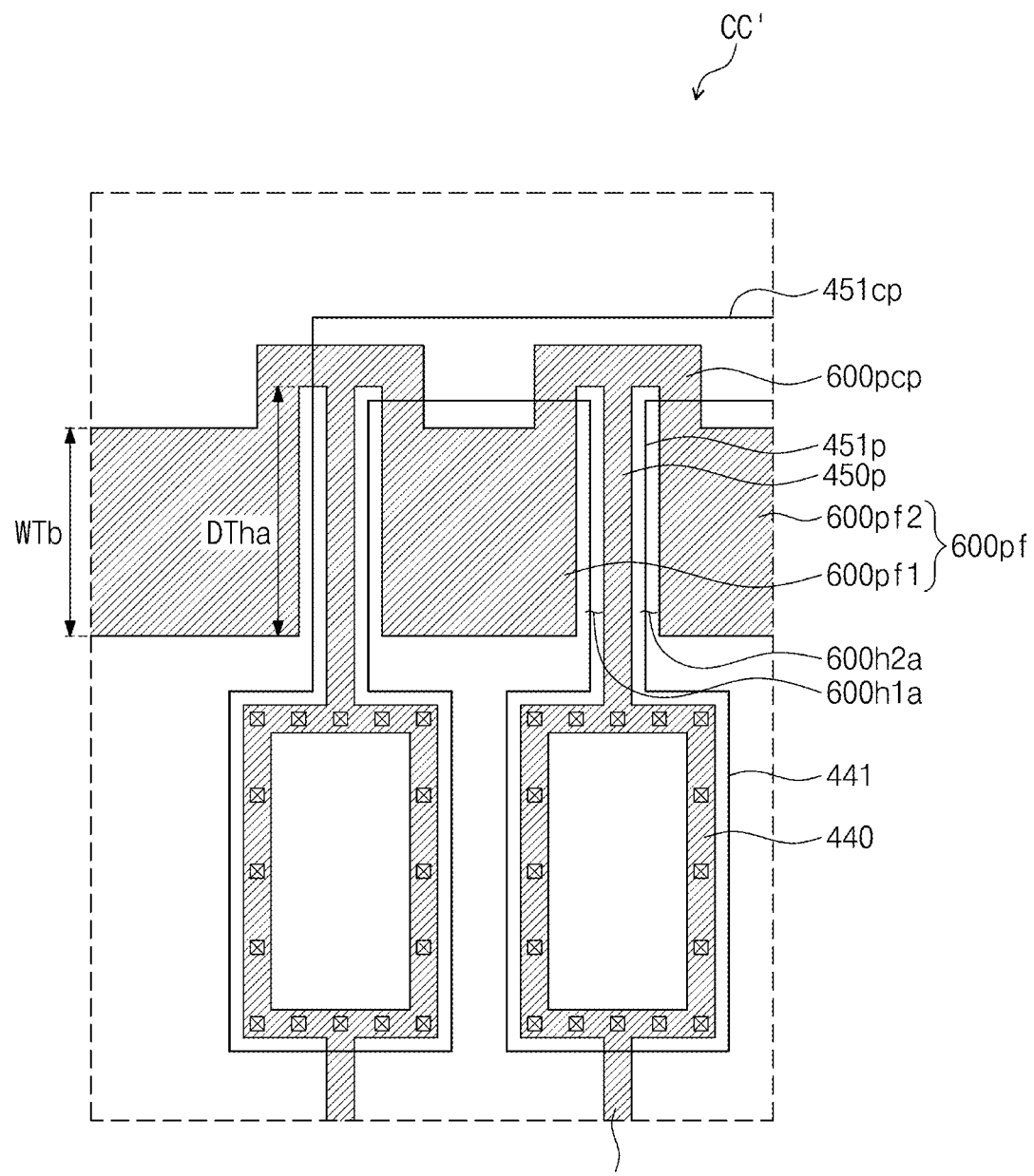
FIG. 19 is an enlarged plan view of area CC' shown in FIG. 12 according to an embodiment.

FIG. 19 is an enlarged plan view of area CC' shown in FIG. 12 according to an embodiment.

Referring to FIG. 19, a light shielding part 600pf according to the illustrated embodiment may include light shielding patterns 600pf1 and 600pf2. The light shielding patterns 600pf1 and 600pf2 may include a first light shielding pattern 600pf1 and a second light shielding pattern 600pf2, which are spaced apart from each other with one protruding portion 450p therebetween.

The preliminary display panel 1000p shown in FIG. 12 may further include an additional connection portion 600pcp. The additional connection portion 600pcp may be connected to one protruding portion 450p, the first light shielding pattern 600pf1, and the second light shielding pattern 600pf2. Alternatively, the additional connection portion 600pcp may be disposed adjacent to one protruding portion 450p, the first light shielding pattern 600pf1, and the second light shielding pattern 600pf2.

Grooves 600h1a and 600h2a each having one end closed by the additional connection portion 600pcp may be defined between the first light shielding pattern 600pf1 and one protruding portion 450p, and between the second light shielding pattern 600pf2 and one protruding portion 450p. Each of the grooves 600h1a and 600h2a may have a length DTha greater than a width WTb of the first light shielding pattern 600pf1 in the second direction DR2.

As the protruding portions 450p are connected to the light shielding part 600pf before the preliminary display panel 1000p is cut, electrostatic discharge that may be generated in the protruding portions 450p may be prevented. Also, even when a portion of each of the first and second light shielding patterns 600*pf*1 and 600*pf*2 is retained after the preliminary display panel 1000*p* is cut, a short-circuit failure between the protruding portions 450*p* may not be generated because the first and second light shielding patterns 600*pf*1 and 600*pf*2 are spaced apart from the protruding portions 450*p*.

FIGS. 20A, 20B, 20C, and 20D are cross-sectional views illustrating a method for manufacturing the display panel according to an embodiment. FIGS. 20A, 20B, 20C, and 20D are cross-sectional views taken along line VI-VI' of FIG. 12.

Figure 20A:
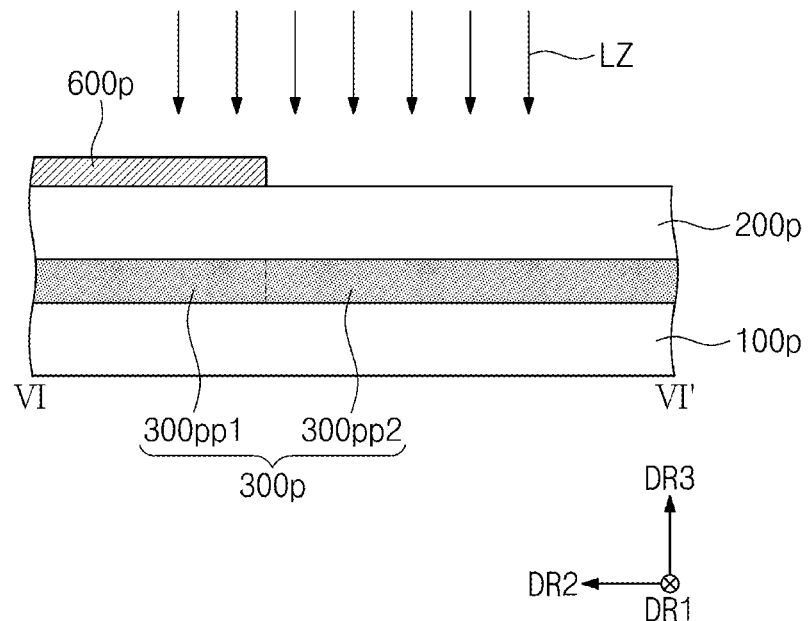
FIGS. 20A, 20B, 20C, and 20D are cross-sectional views illustrating a method for manufacturing the display panel according to an embodiment.

Referring to FIG. 20A, the coupling member 300*p* may be disposed between the first preliminary substrate 100*p* and the second preliminary substrate 200*p*. One portion 300*pp*1 of the coupling member 300*p* may overlap the light shielding part 600*p*.

A laser LZ may be irradiated in a direction towards the coupling member 300*p*. In this case, the laser LZ may not be irradiated to the one portion 300*pp*1 (hereinafter, referred to as a first portion) of the coupling member 300*p* due to the light shielding part 600*p* disposed thereon, and the laser LZ may be irradiated to another portion 300*pp*2 (hereinafter, referred to as a second portion) of the coupling member 300*p*.

The second portion 300*pp*2 of the coupling member 300*p* may be melted by the laser LZ and couple the first preliminary substrate 100*p* and the second preliminary substrate 200*p* to each other. Thus, after the laser LZ is irradiated, the second portion 300*pp*2 may have a coupling force greater than that of the first portion 300*pp*1.

Figure 20B:
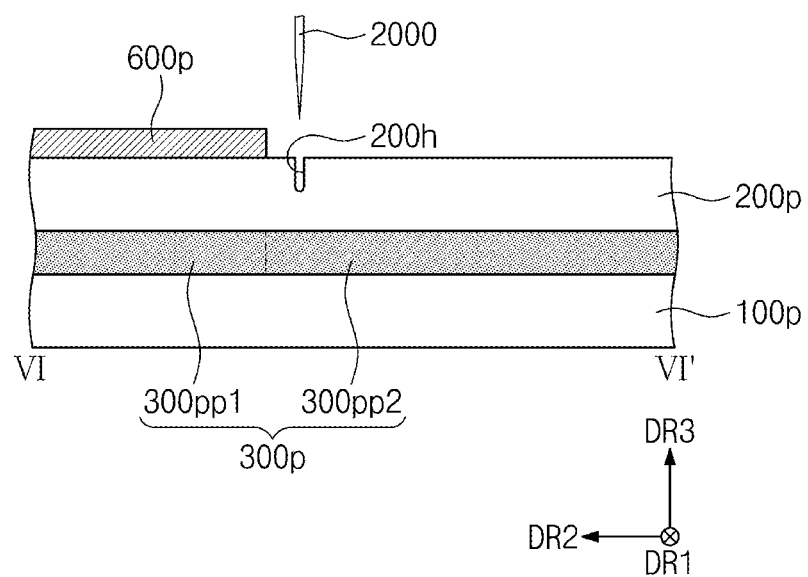

Referring to FIG. 20B, one portion of the second preliminary substrate 200*p* may be cut by a cutting part 2000, and a groove 200*h* may be formed in the second preliminary substrate 200*p*. The one portion may represent one portion in a thickness direction of the second preliminary substrate 200*p*. The cutting part 2000 may be a cutting wheel or a cutting blade, without being limited thereto.

Figure 20C:
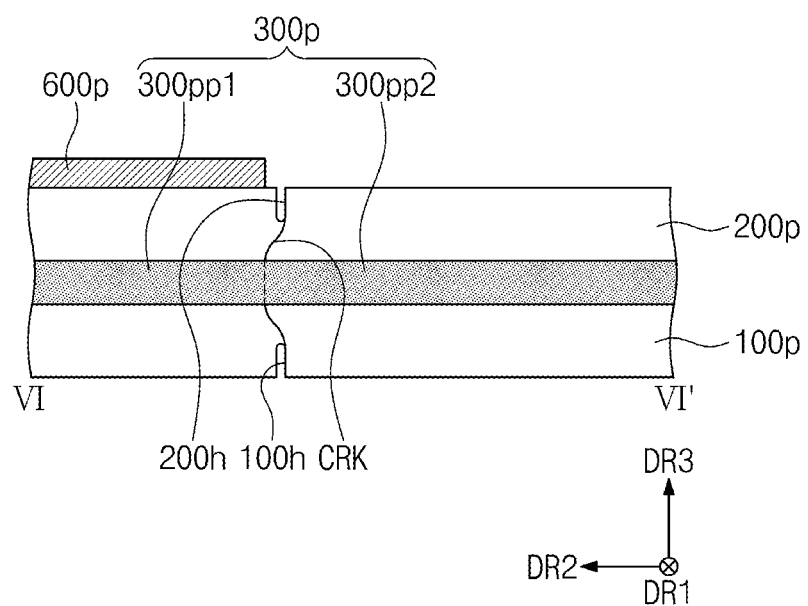

Referring to FIG. 20C, one portion of the first preliminary substrate 100*p* may be cut by the above-described cutting part 2000, and a groove 100*h* may be formed in the first preliminary substrate 100*p*.

A crack CRK may be propagated from each of the groove 100*h* of the first preliminary substrate 100*p* and the groove 200*h* of the second preliminary substrate 200*p* toward a boundary between the first portion 300*pp*1 and the second portion 300*pp*2.

Figure 20D:
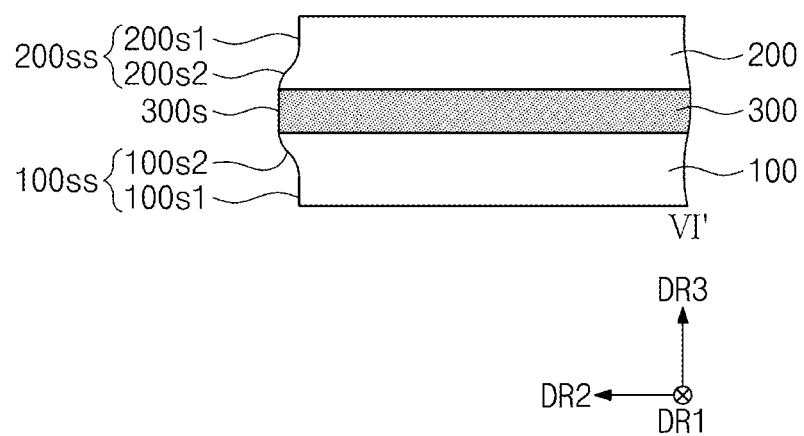

Referring to FIGS. 20C and 20D, a first substrate 100 is formed by cutting the first preliminary substrate 100*p*, and a second substrate 200 is formed by cutting the second preliminary substrate 200*p*. The groove 100*h* of the first preliminary substrate 100*p* may correspond to a first side portion 100*s*1, and the groove 200*h* of the second preliminary substrate 200*p* may correspond to a first side portion 200*s*1. Each of second side portions 100*s*2 and 200*s*2 may be formed by the crack CRK.

Each of the first substrate 100 and the second substrate 200 may include a protruding portion. The protruding portions may be spaced apart from each other with the coupling member 300 therebetween. In this manner, an impact applied from the outside of the display panel 1000 (refer to FIG. 1A) may be evenly distributed to the first substrate 100, the second substrate 200, and the coupling member 300, and thus, the display panel 1000 according to an embodiment may have an improved strength against the external impact.

According to embodiments, when the display panel is provided by cutting the preliminary display panel, a portion of the coupling member that couples the first substrate and the second substrate of the display panel may be cut. As such, as the area of the non-display area of the display panel decreases, the display panel having the narrow bezel may be provided.

According to embodiments, the light shielding pattern may be spaced apart from the protruding portions by a predetermined distance. Thus, even when a portion of the light shielding pattern is remained in the display panel after the preliminary display panel is cut, the short-circuit failure between the protruding portions may not occur. As such, the display panel may have improved manufacturing yield and reliability.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:
a first substrate;
a second substrate disposed on the first substrate and having a display area through which an external input is configured to be sensed and a non-display area around the display area;
a coupling member disposed between the first substrate and the second substrate to couple the first substrate and the second substrate;
a plurality of sensing patterns disposed in the display area of the second substrate;
a plurality of sensing pads disposed in the non-display area of the second substrate and electrically connected to the plurality of sensing patterns, respectively;
a plurality of sensing lines disposed in the non-display area between the plurality of sensing patterns and the plurality of sensing pads and connecting the plurality of sensing patterns to the plurality of sensing pads, respectively;
a plurality of protruding portions disposed in the non-display area of the second substrate and extending in a direction from the plurality of sensing pads, respectively, to an edge of the second substrate; and
a light shielding part disposed between the edge of the second substrate and the plurality of sensing pads to overlap at least a portion of the coupling member,
wherein the plurality of sensing pads are disposed between the plurality of protruding portions and the plurality of sensing patterns, and
wherein the light shielding part is not electrically connected to any protruding portions and any sensing pads.

2. The display panel of claim 1, wherein:
the light shielding part extends in a first direction;
each of the plurality of protruding portions extends in a second direction crossing the first direction; and
the light shielding part and the plurality of protruding portions are connected to each other.

3. The display panel of claim 2, wherein the light shielding part includes a plurality of grooves defined adjacent to an area where the plurality of protruding portions cross the light shielding part.

4. The display panel of claim 3, wherein each of the plurality of grooves extends in the second direction and has a length in the second direction less than a width of the light shielding part in the second direction.

5. The display panel of claim 1, wherein the light shielding part comprises a plurality of light shielding patterns spaced apart from the plurality of protruding portions.

6. The display panel of claim 5, wherein a gap between adjacent light shielding patterns among the plurality of light shielding patterns and a gap between adjacent ones of the plurality of light shielding patterns and the plurality of protruding portions is each equal to or less than about 4 μm.

7. The display panel of claim 5, wherein:
the plurality of light shielding patterns comprise a first light shielding pattern and a second light shielding pattern spaced apart from each other with one of the plurality of protruding portions therebetween; and
the display panel further comprises an additional connection portion connected to the first light shielding pattern, the second light shielding pattern, and the protruding portion.

8. The display panel of claim 7, wherein:
the light shielding part extends in a first direction;
a groove having one end closed by the additional connection portion is defined between the first light shielding pattern and the protruding portion; and
the groove has a length in a second direction crossing the first direction greater than a width of the first light shielding pattern in the second direction.

9. The display panel of claim 1, wherein:
the plurality of protruding portions and the light shielding part are disposed on the same layer and comprise the same material as each other; and
the plurality of protruding portions and the light shielding part are spaced apart from each other.

10. The display panel of claim 9, further comprising:
a connection portion disposed adjacent to the edge of the second substrate and electrically connected to the plurality of protruding portions; and
a plurality of bridge patterns contacting the plurality of protruding portions, respectively, and electrically connected to the connection portion,
wherein the plurality of bridge patterns overlap the light shielding part.

11. The display panel of claim 1, wherein another portion of the coupling member not overlapping the light shielding part has a coupling force greater than the one portion of the coupling member when viewed in a thickness direction of the second substrate.

12. A display panel comprising:
a first substrate;
a second substrate disposed on the first substrate, and having a display area through which an external input is configured to be sensed, a non-display area around the display area, and an edge extending in a first direction;
a sensing pattern disposed in the display area of the second substrate;
a sensing pad disposed in the non-display area of the second substrate and electrically connected to the sensing pattern;
a sensing line disposed in the non-display area between the sensing pattern and the sensing pad and connecting the sensing pattern to the sensing pad;
a protruding portion disposed on the second substrate and extending in a direction from the sensing pad to the edge of the second substrate; and
a light shielding pattern disposed on the second substrate and spaced apart from the protruding portion,
wherein the light shielding pattern is not electrically connected to any sensing pattern and any sensing pad.

13. The display panel of claim 12, wherein the edge of the second substrate overlaps a side surface of the light shielding pattern and a side surface of the protruding portion.

14. The display panel of claim 12, wherein the edge of the second substrate overlaps a side surface of the light shielding pattern, and the protruding portion is spaced apart from the edge of the second substrate with the light shielding pattern therebetween.

15. The display panel of claim 14, further comprising a bridge pattern connected to the protruding portion,
wherein the bridge pattern extends from the protruding portion to the edge of the second substrate and overlaps the light shielding pattern.

16. The display panel of claim 12, wherein the protruding portion and the light shielding pattern are disposed on the same layer and comprise the same material as each other.

17. The display panel of claim 12, wherein a gap between the protruding portion and the light shielding pattern is equal to or less than about 4 μm.

18. The display panel of claim 12, further comprising a coupling member disposed between the first substrate and the second substrate,
wherein the edge of the second substrate overlaps the coupling member.

19. A display panel comprising:
a first substrate;
a second substrate longitudinally extending along a first direction, disposed on the first substrate, and having a top surface, a side surface, and a boundary defined between the top surface and the side surface;
a coupling member disposed between the first substrate and the second substrate;
a sensing pattern disposed on the top surface of the second substrate;
a sensing pad disposed on the top surface of the second substrate and electrically connected to the sensing pattern; and
a sensing line disposed in the non-display area between the sensing pattern and the sensing pad and connecting the sensing pattern to the sensing pad,
wherein the side surface of the second substrate includes a first side portion extending from the boundary and a second side portion extending from the first side portion to a side surface of the coupling member, and
wherein the second side portion protrudes outwardly away from the first side portion in the first direction with respect to the sensing pattern, such that the second side portion is disposed further away from the sensing pattern than the first side portion in the first direction, and
wherein the second side portion is directly viewable from the top surface of the second substrate; and
a protruding portion disposed on the top surface of the second substrate and extending from the sensing pad to the boundary; and
a light shielding pattern disposed on the top surface of the second substrate and spaced apart from the protruding portion,
wherein a side surface of the light shielding pattern is aligned with the boundary of the second substrate.

20. A method of manufacturing a display panel, comprising:
forming a first preliminary substrate;
forming a second preliminary substrate having substantially the same area as the first preliminary substrate, the second preliminary substrate including a plurality of sensing patterns, a plurality of sensing pads respectively connected to the sensing patterns, and a plurality of protruding portions respectively extending from the sensing pads to an edge of the second preliminary substrate;

forming a coupling member between the first and second preliminary substrates;

forming a light shielding part connected to the plurality of protruding portions and between the edge of the second preliminary substrate and the sensing pads to overlap at least a portion of the coupling member;

irradiating the coupling member with a laser to couple the first and second preliminary substrates to each other; and cutting the first preliminary substrate and the second preliminary substrate, wherein the light shielding part blocks the laser and is spaced apart from the protruding portions, and wherein, after the first preliminary substrate and the second preliminary substrate are cut, the light shielding part is electrically separated from the plurality of protruding portions.

* * * * *